United States Patent
Fukuzawa et al.

(10) Patent No.: US 7,505,234 B2
(45) Date of Patent: Mar. 17, 2009

(54) MAGNETORESISTANCE EFFECT ELEMENT, MAGNETIC HEAD, MAGNETIC REPRODUCING APPARATUS, AND MAGNETIC MEMORY

(75) Inventors: Hideaki Fukuzawa, Kanagawa-ken (JP); Hiromi Yuasa, Kanagawa-ken (JP); Hiromi Fuke, Kanagawa-ken (JP); Hitoshi Iwasaki, Kanagawa-ken (JP); Masashi Sahashi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/930,699

(22) Filed: Oct. 31, 2007

(65) Prior Publication Data

US 2008/0062577 A1   Mar. 13, 2008

Related U.S. Application Data

(63) Continuation of application No. 10/400,690, filed on Mar. 28, 2003, now Pat. No. 7,301,733.

(30) Foreign Application Priority Data

Mar. 28, 2002   (JP) .......................... P2002-092998
Sep. 9, 2002   (JP) .......................... P2002-263251

(51) Int. Cl.
   *G11B 5/33*   (2006.01)
   *G11B 5/127*   (2006.01)

(52) U.S. Cl. .................................................. 360/324.1

(58) Field of Classification Search ...... 360/324–324.2, 360/324.11, 324.12
See application file for complete search history.

(56) References Cited

U.S. PATENT DOCUMENTS 5,715,121 A   2/1998   Sakakima et al.

(Continued)

FOREIGN PATENT DOCUMENTS

JP   2001-237471   8/2001

(Continued)

OTHER PUBLICATIONS

U.S. Appl. No. 11/931,089, filed Oct. 31, 2007, Fukuzawa et al.

(Continued)

*Primary Examiner*—Angel A. Castro
(74) *Attorney, Agent, or Firm*—Oblon, Spivak, McClelland, Maier & Neustadt, P.C.

(57) ABSTRACT

A magnetoresistance effect element comprises a magnetoresistance effect film and a pair of electrode. The magnetoresistance effect film having a first magnetic layer whose direction of magnetization is substantially pinned in one direction; a second magnetic layer whose direction of magnetization changes in response to an external magnetic field; a nonmagnetic intermediate layer located between the first and second magnetic layers; and a film provided in the first magnetic layer, in the second magnetic layer, at a interface between the first magnetic layer and the nonmagnetic intermediate layer, and/or at a interface between the second magnetic layer and the nonmagnetic intermediate layer, the film having a thickness not larger than 3 nanometers, and the film has as least one selected from the group consisting of oxide, nitride, oxinitride, phosphide, and fluoride. The pair of electrodes are electrically connected to the magnetoresistance effect film to supply a sense current perpendicularly to a film plane of said magnetoresistance effect film.

12 Claims, 21 Drawing Sheets

U.S. PATENT DOCUMENTS

| | | |
|---|---|---|
| 6,013,365 A | 1/2000 | Dieny et al. |
| 6,303,218 B1 | 10/2001 | Kamiguchi et al. |
| 6,348,274 B1 | 2/2002 | Kamiguchi et al. |
| 6,452,763 B1 | 9/2002 | Gill |
| 6,556,390 B1 | 4/2003 | Mao et al. |
| 6,567,246 B1 | 5/2003 | Sakakima et al. |
| 6,686,068 B2 | 2/2004 | Carey et al. |
| 6,770,382 B1 | 8/2004 | Chang et al. |
| 6,853,520 B2 | 2/2005 | Fukuzawa et al. |
| 6,882,509 B2 | 4/2005 | Chang et al. |
| 6,937,446 B2 | 8/2005 | Kamiguchi et al. |
| 7,301,733 B1 * | 11/2007 | Fukuzawa et al. ........ 360/324.1 |
| 2002/0051380 A1 | 5/2002 | Kamiguchi et al. |
| 2003/0011463 A1 | 1/2003 | Iwasaki et al. |
| 2004/0021990 A1 | 2/2004 | Koui et al. |
| 2007/0081276 A1 | 4/2007 | Fukuzawa et al. |

FOREIGN PATENT DOCUMENTS

| | | |
|---|---|---|
| JP | 2002-150512 | 5/2002 |
| JP | 2003-152243 | 5/2003 |

OTHER PUBLICATIONS

U.S. Appl. No. 11/930,699, filed Oct. 31, 2007, Fukuzawa et al.

I. I. Mazin, "How to Define and Calculate the Degree of Spin Polarization in the Ferromagnets", Physical Review Letters, vol. 83, No. 7, Aug. 16, 1999, 1427-1430.

* cited by examiner

MAGNETORESISTANCE EFFECT ELEMENT, MAGNETIC HEAD, MAGNETIC REPRODUCING APPARATUS, AND MAGNETIC MEMORY

CROSS-REFERENCE TO RELATED APPLICATIONS

This application is a continuation of U.S. Ser. No. 10/400, 690, filed on Mar. 28, 2003 (now U.S. Pat. No. 7,301,733), and is based upon and claims the benefit of priority from the prior Japanese Patent Application No. 2002-092998, filed on Mar. 28, 2002, and the prior Japanese Patent Application No. 2002-263251, filed on Sep. 9, 2002; the entire contents of which are incorporated herein by reference.

BACKGROUND OF THE INVENTION

This invention relates to a magnetoresistance effect element, a magnetic head, a magnetic reproducing apparatus, and a magnetic memory and more particularly, to a magnetoresistance effect element which has a structure where a sense current is passed perpendicularly to a film plane of the magnetoresistance effect film, and to a magnetic head using the same, a magnetic reproducing apparatus and a magnetic memory.

By discovery of the Giant MagnetoResistance effect (GMR) in the laminated structure of magnetic layers, the performance of a magnetic device, especially a magnetic head is improving rapidly. Especially application to a magnetic head and MRAM (Magnetic Random Access Memory) of spin valve film structure (Spin-Valve: SV film) brought big technical progress to the magnetic device field.

A "spin valve film" has a structure which sandwiches a non-magnetic layer between two ferromagnetic layers. The magnetization of one ferromagnetic layer (called a "pinned layer" or a "magnetization pinned layer", etc.) is fixed by an antiferromagnetic layer etc., and the magnetization direction of another ferromagnetic layer (called a "free layer", a "magnetization free layer", etc.) is rotatable in a response to an external magnetic field. And when the relative angle of the magnetization direction of a pinned layer and a free layer changes, a giant magnetoresistance change is obtained.

A CPP (Current-Perpendicular-to-Plane) type magnetoresistance effect element which passes sense current to a perpendicular direction to a film plane of such a spin valve film shows the still larger GMR effect compared with a conventional CIP (Current-In-Plane) type magnetoresistance effect element which passes sense current in parallel to a film plane.

On the other hand, a TMR element using the TMR effect (Tunneling MagnetoResistance effect) is also developed, which passes the current to a perpendicular direction as the CPP type GMR elements. However, in a TMR element, since the tunnel effect is used, when thickness of the non-magnetic intermediate layer made of alumina, for example, is made thin, there is a problem that MR rate of change decreases rapidly.

In the case of a TMR element, in the state where alumina is not made thin, resistance is very high. When application to a magnetic head is considered, its adoption is difficult from a viewpoint of a shot noise and a high frequency response. For example, in order to use for a magnetic head, AR (current passed area×element resistance) must be set to 1 $\Omega\mu m^2$ or less. However, in the case of a TMR element, there is a problem that MR rate of change disappears in this resistance level.

On the other hand, a CPP type magnetoresistance effect element has the advantage which has larger MR rate of change compared with a CIP type magnetoresistance effect element. In the case of a CPP type element, resistance of an element is dependent on element area. Therefore, when the miniaturization of the element is carried out, it also has an advantage that the amount of resistance change increases. This advantage serves as a big merit in the present when the miniaturization of a magnetic device progresses. Therefore, a CPP type magnetoresistance effect element and the magnetic head using it are considered to be the major candidates for realizing storage density from 200 gigabits per square inch (200 Gbpsi) to one Tbits per square inch class.

In the case of a TMR element, since an insulator is used for an intermediate layer, element resistance becomes high too much. For this reason, if the miniaturization of the element area is carried out, originating in high resistance and causing shot noise generating peculiar to a tunnel phenomenon and high frequency response degradation will pose problems. For this reason, a means of realistic solution is not found in application of a TMR element in high storage density of 200 or more Gbpsi.

In MRAM, tolerance level of element resistance is comparatively wide compared with a magnetic head. It is thought that a TMR element is applicable to MRAM of a first generation. However, also in MRAM, the miniaturization of the element area is carried out with improvement in storage density, and it is expected that a problem that the resistance becomes too high comes out. That is, also in any of a magnetic head and MRAM, high resistance peculiar to a TMR element poses a problem with improvement in storage density.

On the other hand, in the case of a CPP element using a metal non-magnetic intermediate layer, since the element resistance is very small unlike the TMR elements, the amount of resistance change is small while MR rate of change is large. As a result, it is difficult to acquire a high reproduction output signal. And in the case of spin valve film structure where realization possibility is the highest, only a free layer and a pinned layer are provided as the magnetic layers. That is, compared with a case of the artificial lattice multilayer structure, thickness and interfaces which contribute to MR rate of change are both insufficient. For this reason, MR rate of change becomes remarkably small compared with a practical MR rate of change.

In order to solve a pan of this problem, by laminating an oxide layer for the CPP clement which used the metal non-magnetic intermediate layer, increase of element resistance is aimed at and the trial to raise the amount of resistance change as for the same MR rate of change is made (K. Nagasaka et al. The 8th Joint MMM-Intermag Conference, DD-10).

In the case of this method, a metallic low resistance area is established in pinholes in part of oxide layer, and it aims to obtain a high resistance by constricting the current. However, it is difficult to provide pinholes uniformly. Resistance varies largely especially in a storage density of 100 Gbpsi or more for which element size of about 0.1 micrometers is needed. For this reason, fabrication of stable CPP elements is difficult.

By this technique, an increase in large MR rate of change cannot be realized, but resistance is just adjusted. That is, though MR rate of change does not change, if AR is raised, it is expected that the amount AdR of resistance change expressed with the product of MR rate of change expressed with percentage and AR win improve. Since area which contributes to MR rate of change becomes small effectually, MR rate of change seen from the whole may increase.

However, since element size becomes small so that it becomes high storage density, the resistance demanded from a viewpoint of a shot noise and the high frequency response characteristic must be small, for example, a case of storage density of 200 Gbpsi, tolerance level of AR (current passing area×resistance) is from about one mΩμm² to a few hundreds mΩμm². On the other hand, in the case of 500 Gbpsi class storage density, AR must be less than 500 mΩμm². This is because element resistance becomes large, when the element size accompanying improvement in storage density contracts. Thus, it is required that AR should be made small with improvement in storage density. Therefore, it is clear that there is a limit in an approach to increase AdR (current passing area×resistance change) by increasing AR while keeping MR at a fried value. That is, the essential improvement in the MR rate of change itself is needed with improvement in storage density.

In order to improve a situation, research of a half metal prospers aiming at the essential improvement in MR rate of change. Generally, it is defined as a "half metal" being a magnetic material with which only either of the densities of states of a up-spin electron and a down-spin electron exists near Fermi level. When an ideal half metal is realized, two states of an infinite resistance state and a low resistance state are formed corresponding to the two magnetization states of the pinned layer and the free layer of an anti-parallel state and a parallel state. Therefore, MR rate of change of infinite size is ideally realizable.

Such an ideal state may be unable to be realized in fact. However, if a difference of density of states of a up spin electron and a down spin electron becomes larger than conventional material, an increase of MR rate of change does not remain in improvement in about 2 times, but a rise of 3 times, 4 times, and still more nearly extraordinary fast MR rate of change is expected.

That is, unlike the conventional solution mentioned above, improvement in large MR rate of change becomes essentially possible. However, there is a big problem which obstructs utilization which is explained below in a half metal investigated intensively now.

That is, the following material can be mentioned as a half metal material investigated until now. CrAs of semiconducting materials, such as NiMnSb of the CrO2 and the Whistler alloy with rutile structures, such as $Fe_3O_4$ with spinel structure, LaSrMnO with perovskite structure, and LaCaMnO, ZnO, GaNMn. Many of these materials have a complicated crystal structure. For this reason, in order to form a high quality crystal, substrate heating to a high temperature or special film formation technique is required. There is a problem that these processes are not easy to carry out in a creation process of an actual magnetoresistance effect element. This is the first problem.

A problem mentioned above may be solved by improvement of film formation technology. However, there are the following problems as a still more essential problem. That is, any case of half metal material known until now, a limit of curie temperature (Tc: in the case of Ferro magnetism) and Neel temperature (Tn: in the case of ferrimagnetism or antiferromagnetism) is at most 400K (about 100 degrees in centigrade) Since temperature which shows half metal nature (here, it is defined as Thm) becomes the lower temperature side, there is a problem that material which shows half metal nature in room temperature is not yet found. This is the second problem.

Thus, if half metal nature is realizable only at low temperature, the application to a consumer product is completely impossible. In order to use it as an actual magnetoresistance effect element, half metal appearance temperature Thm must be at least 150-200 degrees in centigrade or higher. In order to make Thm high, it is required to make Tc or Tn higher. However, with material investigated until now, Tc or Tn beyond room temperature hardly exists. Intensive research is made in order to raise Tc and Tn, but a decisive solution which raises Tc or Tn in every material cannot be found.

There are the following problems as the third big problem. That is, even if a half metal is realized in a single layer film, when it is provided in a multilayered structure like a spin valve, there is a problem that half metal nature in a laminated film interface is lost. This is because band structures differ in a bulk state in an interface of the lamination structure. Although a half metal is realized in a single layer film, there is a problem that a half metal is unrealizable in an interface or the surface. In a part of magnetic semiconductor material (CrAs), there is a report that a half metal of high Tc was realized. However, generally in an interface of a semiconducting material and metal material, diffusion is intense. For this reason, it is very difficult for half metal nature to be made not to be lost in a junction interface.

When using these magnetic semiconductor material, it is desirable to also constitute a non-magnetic spacer layer from a semiconducting material, and the combination with metal material is not realistic. If a specific material in an interface layer is not laminated in the case of the Heusler alloy material, such as NiMnSb, it is pointed out that half metal nature cannot be essentially realized (G. A. de Wijs et al., Phys. Rev. B 64, 020402-1). This originates in half metal nature being lost in a laminated structure interface, since symmetry in band structure of a crystal collapses near the interface.

With a CPP element using the Heusler alloy, even if measured at 4.2K or less cryogenic temperature which is the temperature below Tc, only MR rate of change lower than a spin valve film formed with the usual metal is observed. This is based on above explained problem.

With spin valve film structure, it must essentially be made a laminated structure. Since half metal nature will be lost near the interface, it is meaningless to pursue material which half metal nature by using a single layer of a single crystal.

As other means, there is a method of using a half metal as a material of a spacer layer. Here, a "spacer layer" is a nonmagnetic layer which divides the pinned layer and the free layer in the case of a CPP element. An improved result using a perovskite system oxide is reported. For example, although Tc and Thm are still low temperature, when measured at temperature below Tc, a TMR element realized quite larger MR rate of change than a spin valve film of the usual magnetic material (J. Z. Sun et al., Appl. Phys. Lett. 69, and 3266 (1996)). However, it is difficult to create the pinned layer, the spacer layer, and the free layer using material with a special crystal structure like perovskite. And the above-mentioned second problem that Tc is low temperature is still not solved at all.

Thus, in extension of research of a half metal studied intensively now, realization of a high MR rate of change is difficult even in low temperature. Even if it is realized, a still bigger breakthrough for realizing large MR rate of change at room temperature will be needed.

SUMMARY OF THE INVENTION

According to an embodiment of the invention, there is provided a magnetoresistance effect element comprising: a magnetoresistance effect film having: a first magnetic layer whose direction of magnetization is substantially pinned in one direction; a second magnetic layer whose direction of magnetization changes in response to an external magnetic field; a nonmagnetic intermediate layer located between the first and second magnetic layers; and a film provided in the first magnetic layer, in the second magnetic layer, at an interface between the first magnetic layer and the nonmagnetic intermediate layer, or at an interface between the second magnetic layer and the nonmagnetic intermediate layer, the film having a thickness not larger than 3 nanometers, and the film having at least one selected from the group consisting of oxide, nitride, oxinitride, phosphide, and fluoride; and a pair of electrodes electrically coupled to the magnetoresistance effect film and configured to supply a sense current perpendicularly to a film plane of said magnetoresistance effect film.

According to other embodiment of the invention, there is provided a magnetoresistance effect element comprising: a magnetoresistance effect film having: a first magnetic layer whose direction of magnetization is substantially pinned in one direction; a second magnetic layer whose direction of magnetization changes in response to an external magnetic field; a nonmagnetic intermediate layer located between the first and second magnetic layers; and a film provided in the first magnetic layer, in the second magnetic layer, at an interface between the first magnetic layer and the nonmagnetic intermediate layer, and/or at an interface between the second magnetic layer and the nonmagnetic intermediate layer, and the film having at least one selected from the group consisting of oxide, nitride, oxinitride, phosphide, and fluoride; and a pair of electrodes electrically coupled to the magnetoresistance effect film to supply a sense current perpendicularly to a film plane of said magnetoresistance effect film, wherein a product AR of an area A and resistance R is equal to or smaller than $500 \, m\Omega\mu m^2$, where the area A is an area of a portion of the magnetoresistance effect film that the sense current substantially passes through, and the resistance R is a resistance obtained between the pair of electrodes, or a resistance R between the pair of electrodes is equal to or smaller than $100 \, \Omega$.

According to other embodiment of the invention, there is provided a magnetic head comprising a magnetoresistance effect element having; a magnetoresistance effect film having: a first magnetic layer whose direction of magnetization is substantially pinned in one direction; a second magnetic layer whose direction of magnetization changes in response to an external magnetic field; a nonmagnetic intermediate layer located between the first and second magnetic layers; and a film provided in the first magnetic layer, in the second magnetic layer, at an interface between the first magnetic layer and the nonmagnetic intermediate layer, or at an interface between the second magnetic layer and the nonmagnetic intermediate layer, the film having a thickness not larger than 3 nanometers, and the fm having at least one selected from the group consisting of oxide, nitride, oxinitride, phosphide, and fluoride; and a pair or electrodes electrically coupled to the magnetoresistance effect film and configured to supply a sense current perpendicularly to a film plane of said magnetoresistance effect film.

According to other embodiment of the invention, there is provided a magnetic head comprising a magnetoresistance effect element having; a magnetoresistance effect film having: a first magnetic layer whose direction of magnetization is substantially pinned in one direction; a second magnetic layer whose direction of magnetization changes in response to an external magnetic field; a nonmagnetic intermediate layer located between the first and second magnetic layers; and a film provided in the first magnetic layer, in the second magnetic layer, at an interface between the first magnetic layer and the nonmagnetic intermediate layer, and/or at an interface between the second magnetic layer and the nonmagnetic intermediate layer, and the film having at least one selected from the group consisting of oxide, nitride, oxinitride, phosphide, and fluoride; and a pair of electrodes electrically coupled to the magnetoresistance effect film to supply a sense current perpendicularly to a film plane of said magnetoresistance effect film, wherein a product AR of an area A and resistance R is equal to or smaller than $500 \, m\Omega\mu m^2$, where the area A is an area of a portion of the magnetoresistance effect film that the sense current substantially passes through, and the resistance R is a resistance obtained between the pair of electrodes, or a resistance R between the pair of electrodes is equal to or smaller than $100 \, \Omega$.

According to other embodiment of the invention, there is provided a magnetic reproducing apparatus which reads information magnetically recorded in a magnetic recording medium, the magnetic reproducing apparatus comprising a magnetic head having a magnetoresistance effect element including: a magnetoresistance effect film having: a first magnetic layer whose direction of magnetization is substantially pinned in one direction; a second magnetic layer whose direction of magnetization changes in response to an external magnetic field; a nonmagnetic intermediate layer located between the first and second magnetic layers; and a film provided in the first magnetic layer, in the second magnetic layer, at an interface between the first magnetic layer and the nonmagnetic intermediate layer, or at an interface between the second magnetic layer and the nonmagnetic intermediate layer, the film having a thickness not larger than 3 nanometers, and the film having at least one selected from the group consisting of oxide, nitride, oxinitride, phosphide, and fluoride; and a pair of electrodes electrically coupled to the magnetoresistance effect film and configured to supply a sense current perpendicularly to a film plane of said magnetoresistance effect film.

According to other embodiment of the invention, there is provided a magnetic reproducing apparatus which reads information magnetically recorded in a magnetic recording medium, the magnetic reproducing apparatus comprising a magnetic head having a magnetoresistance effect element including: a magnetoresistance effect film having: a first magnetic layer whose direction of magnetization is substantially pinned in one direction; a second magnetic layer whose direction of magnetization changes in response to an external magnetic field; a nonmagnetic intermediate layer located between the first and second magnetic layers; and a film provided in the first magnetic layer, in the second magnetic layer, at an interface between the first magnetic layer and the nonmagnetic intermediate layer, and/or at an interface between the second magnetic layer and the nonmagnetic intermediate layer, and the film having at least one selected from the group consisting of oxide, nitride, oxinitride, phosphide, and fluoride; and a pair of electrodes electrically coupled to the magnetoresistance effect film to supply a sense current perpendicularly to a film plane of said magnetoresistance effect film, wherein a product AR of an area A and resistance R is equal to or smaller than $500 \, m\Omega\mu m^2$, where the area A is an area of a portion of the magnetoresistance effect film that the sense current substantially passes through, and the resistance R is a resistance obtained between the pair of electrodes, or a resistance R between the pair of electrodes is equal to or smaller than $100 \, \Omega$.

According to other embodiment of the invention, there is provided a magnetic memory comprising a plurality of magnetoresistance effect elements arranged in a matrix fashion, the magnetoresistance effect element including: a magnetoresistance effect film having: a first magnetic layer whose direction of magnetization is substantially pinned in one direction; a second magnetic layer whose direction of magnetization changes in response to an external magnetic field; a nonmagnetic intermediate layer located between the first and second magnetic layers; and a film provided in the first magnetic layer, in the second magnetic layer, at an interface between the first magnetic layer and the nonmagnetic intermediate layer, or at an interface between the second magnetic layer and the nonmagnetic intermediate layer, the film having a thickness not larger than 3 nanometers, and the film having at least one selected from the group consisting of oxide, nitride, oxinitride, phosphide, and fluoride; and a pair of electrodes electrically coupled to the magnetoresistance effect film and configure to supply a sense current perpendicularly to a film plane of said magnetoresistance effect film.

According to other embodiment of the invention, there is provided a magnetic memory comprising a plurality of magnetoresistance effect elements arranged in a matrix fashion, the magnetoresistance effect element including: a magnetoresistance effect film having: a first magnetic layer whose direction of magnetization is substantially pinned in one direction; a second magnetic layer whose direction of magnetization changes in response to an external magnetic field; a nonmagnetic intermediate layer located between the first and second magnetic layers; and a film provided in the first magnetic layer, in the second magnetic layer, at an interface between the first magnetic layer and the nonmagnetic intermediate layer, and/or at an interface between the second magnetic layer and the nonmagnetic intermediate layer, and the film having at least one selected from the group consisting of oxide, nitride, oxinitride, phosphide, and fluoride; and a pair of electrodes electrically coupled to the magnetoresistance effect film to supply a sense current perpendicularly to a film plane of said magnetoresistance effect film, wherein a product AR of an area A and resistance R is equal to or smaller than 500 m$\Omega\mu^2$, where the area A is an area of a portion of the magnetoresistance effect film that the sense current substantially passes through, and the resistance R is a resistance obtained between the pair of electrodes, or a resistance R between the pair of electrodes is equal to or smaller than 100 $\Omega$.

According to embodiment of the invention, a magnetic field detection with a high sensitivity can be stably obtained and a magnetic head having a high output and high S/N even at a high recording density and a magnetic reproducing apparatus, and a magnetic memory of the degree of high integration can be realized with low power consumption, and the merit on industry is great.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings.

DETAILED DESCRIPTION

Figure 1:
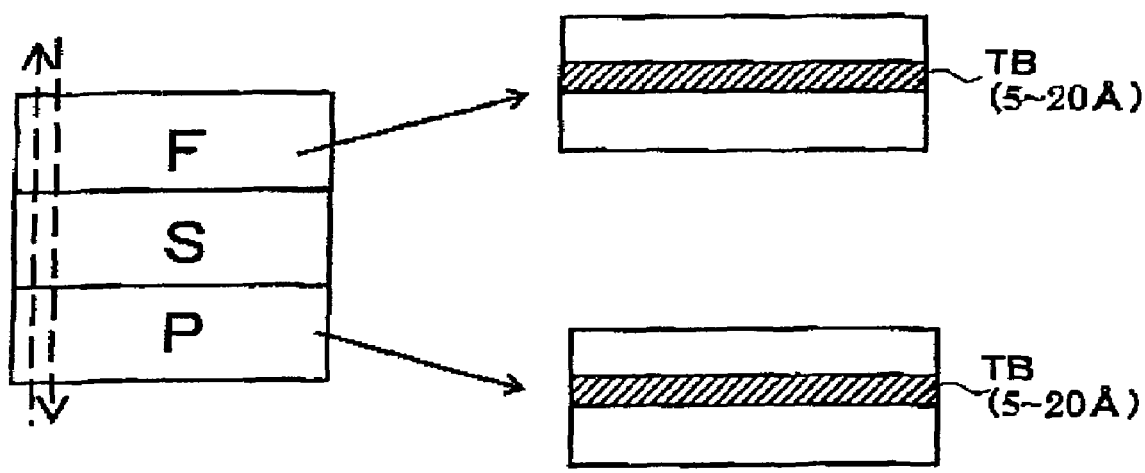
FIG. 1 is a schematic diagram for explaining the basic concept of the invention.

Unlike a TMR element, a CPP element is excellent in a shot noise or a high frequency response. In a CPP element, in order to obtain sufficient output without causing element resistance increase, essential increase in MR rate of change is needed. For that purpose, it is required to use a half metal with a high rate of spin polarization for a pinned layer or a free layer, or for both a pinned layer and a free layer.

However, realization of a half metal with Tc (or Tn) beyond room temperature needed for actual application is difficult with the conventional half metal technology. That is, realization of a high MR rate of change near the room temperature is difficult.

Then, in the invention, a new material structure which shows half metal nature in a room temperature with the spin valve structure has been examined. If such completely new material structure is realized, a high MR rate of change can be realized. Therefore, a high AdR can be realized, without increasing the resistance. Then a magnetoresistance effect element showing a large resistance change dR and a large output voltage is realized. As the result, a magnetoresistance effect element suitable for a high-density recording, a magnetic head using it, magnetic reproducing apparatus (Hard Disk Drive etc.) that carries it, and MRAM having a large capacity can be offered.

All the half metal material studied now was material with low Tc. Conversely, there was a problem that the rate of spin polarization was low in the case of the material which has a high Tc. Although the rate of spin polarization is low, the following materials can be mentioned as a material with high Tc:

That is, iron (Fe), cobalt (Co) and nickel (Ni) which have ferromagnetism, and alloy materials which contain any these elements as a main component can be mentioned. These materials have a Tc of hundreds of degrees in centigrade, and have a very stable magnetism even at high temperatures.

A inventors have considered whether the halt metal characteristic is realizable by using alloy materials which contain these elements as a main component. Such materials base on a simple bcc (body centered cubic) metal, fcc (face centered cubic) metal, or hcp (hexagonal close-packed) metal.

The inventors have greatly converted the way of thinking from the conventional approach toward a half metal. And in order to enlarge the rate of spin polarization of electronic conduction in materials having high Tc, the invention has been made.

That is, as mentioned above, in the conventional approach for a half metal, it does not start from a laminated structure like a spin valve but premised on the material which has half metal nature in a single layer. As a result, the creation of material which has a complicated crystal structure and low Tc has been studied, and the approach of creating spin valve structure like CPP or TMR was taken using those materials. That is, creating an artificial material was not performed. According to such a conventional approach, many problems arise as explained above.

The inventors noted that half metal nature was a phenomenon resulting from band structure of a crystal. Then, the inventors resulted in a conclusion that half metal nature can be realized also in a high temperature beyond room temperature even in a spin valve structure which used the conventional high Tc metal material as a base by performing delicate band modulations. Specifically, a very thin layer of an oxide, a nitride, an oxinitride, a phosphide, or a fluoride layer of a thickness of about 0.2 nm-3 nm is inserted into a ferromagnetic layer having a high Tc. Thus, it was found out that MR rate of change of the CPP characteristic increased greatly, without causing a rise in resistance. It is thought that MR rate of change improved according to the band modulation effect.

In research of the conventional half metal material in a complicated crystal structure, half metal nature is greatly lost near the interface which changes crystal band structure. On the other hand, the invention bases on the approach to use the conventional magnetic material of high Tc, and to realize a half metal nature by using an interfacial phenomenon induced by the very tin oxide layer (or a nitride, an oxinitride, a phosphide, or a fluoride layer). In this case, since the material of high Tc is used from the beginning unlike the approach of the conventional half metal research, efforts to raise Tc are unnecessary.

In the specification, the very thin layers aiming at band modulation such as oxide, nitride, fluoride, etc. are called "a very thin oxide layer TB." However, also when it is called a very thin oxide layer TB, it may not be limited to an oxide layer but may include a nitride layer, an oxinitride layer, a phosphide layer, and a fluoride layer. It becomes possible to produce the artificial band modulation effect by a very thin oxide layer TB. Then, two or more layers are inserted into a ferromagnetic layer, or a surprising band structural change is attained by changing a lamination cycle etc. at variety. It becomes possible as the result to create many artificial substances. Compared with the approach which forms a complicated crystal structure which has been made conventionally, many artificial substances can be far formed with a realistic means using the thin film formation technology which can be mass-produced.

First, material of a pinned layer and a free layer is explained. For this material, 3d transition metals which have sufficiently high (hundreds of degrees in centigrade) Tc can be used as a base. Specifically, magnetic metal material with Tc beyond room temperature, such as iron (Fe), cobalt (Co), nickel (nickel), these alloys, and these alloys including still another clement can be used as a base.

If such material is used as a base, a problem of Tc will completely be lost. Usually, although there are few differences in density of states of up spin electron and down spin electron in such materials, and the difference is very small it cannot be called "half metal nature." This has determined a limit of MR rate of change of the conventional CPP spin valve stricture. That is, although a problem of Tc temperature was removed, a rate of spin polarization needs to be increased.

However, when inserting a very thin oxide layer into such common magnetic metal material, band structure of a magnetic metal near the oxide layer shows a big change. That is, it is expected easily that band structure changes greatly when oxygen or a nitrogen element combines with metallic elements. However, if the usual metal oxide material is formed thickly, resistance in case an electron passes the layer at the time of perpendicular current passing will become high. With the oxide in these comparatively thick films, it is expected simply that half metal nature cannot be realized.

Since it will become like a tunnel barrier if thickness of an oxide layer aiming at band modulation becomes thick, the increase of resistance is produced. However, band structure of a magnetic metal material near the very thin oxide layer can be modulated, without causing large increase of resistance, when thickness of the oxide layer is thin enough. Since high Tc magnetism metal material is used as a base when such a very thin oxide layer is used, half metal nature can be advantageously realized even at room temperature.

FIG. 1 is a schematic diadem for explaining the basic concept of the invention. As expressed in this figure, spin valve structure is based on laminated structure where a spacer layer S is inserted between a pinned layer P and a free layer F. These pinned layer P and a free layer F consist of a ferromagnetic substance which used iron (Fe), cobalt (Co), nickel (nickel), or manganese (M) with high Tc or Tn as a base. In the invention, a very thin oxide layer TB is inserted into a pinned layer P and/or a free layer F which consists of these ferromagnetic substances.

Then, band structure changes near this very thin oxide layer TB, and a rate of a spin polarization of a conduction electron which passes that interface improves rather than the conventional ferromagnetic substance material of high Tc or high Tn. Consequently, the half-metal-like characteristic is realized and MR rate of change of a CPP element improves. As band structure acquired here, it does not need to be limited by narrow definition like the conventional half metal. The reason is explained below.

Figures 2A, 2B:
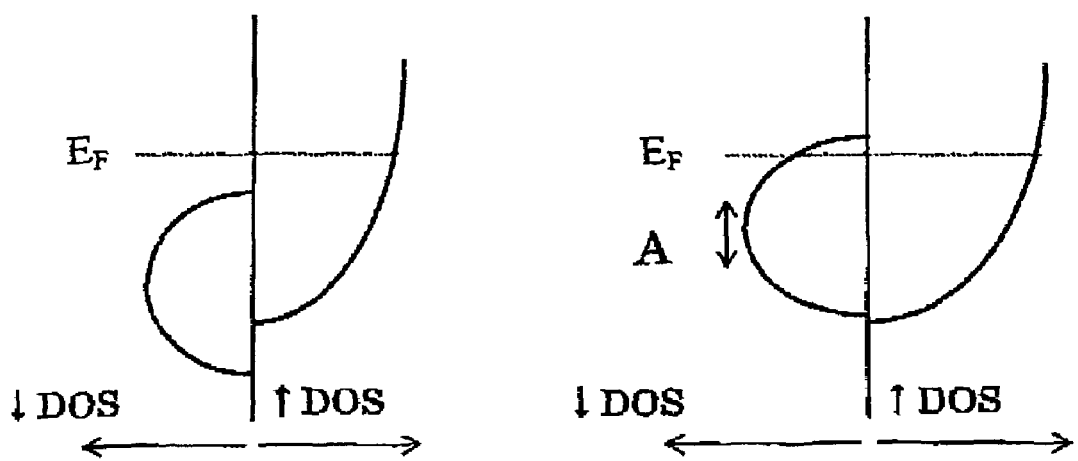
FIG. 2A is a schematic diagram showing band structure of the usual half metal.
FIG. 2B is a schematic diagram showing band structure acquired by very thin oxide layer in the invention.

FIG. 2A is a schematic diagram showing band structure of the usual half metal, and FIG. 2B is a schematic diagram showing band structure acquired by very thin oxide layer in the invention. Namely, in this figure (a) and (b), the vertical axis expresses the energy, the left-hand side of the horizontal axis expresses the density of states of the down spin electrons, and the right-hand side of the horizontal axis express the density of states of the up spin electrons, respectively.

According to the definition of the conventional "half metal", the conditions where density of states (DOS) exist in either an up spin electron or a down spin electron correspond to a "half metal." However, when pursuing half metal nature as the conduction characteristic, such conditions are not necessarily required.

A model of DOS by definition of the conventional "half metal" is shown in FIG. 2A. In the case of an example expressed in this figure, only density of states of an up spin electron exists, and density of states of a down spin electron does not exist near the Fermi level.

Since only electrons near the Fermi level can contribute to conduction, only an up spin electrons can contribute to conduction and down spin electrons cannot contribute it in this situation. For this reason, it is called a "half metal."

Only from a viewpoint of such DOS, search of the half metal material by band calculation etc. has so far been performed. If this viewpoint is persisted in, a half metal which uses iron (Fe), cobalt (Co), or nickel (nickel) as a base will not be proposed.

However, what is required for a CPP element is that a half metal nature is obtained when electrons are made to conduct. And in order to fill this demand, severe conditions that one of DOS of a up spin electron or a down spin electron dues not exist completely at the Fermi level are not needed.

That is, as expressed in FIG. 2B, a spin polarization does not have to be carried out completely. As shown in Table 1, in a CPP element, a difference of the Fermi speed of an up spin electron and a down spin electron is required. If a difference of the Fermi speed of an up spin electron and a down spin electron is large, a ratio of a conduction electron contributed to conduction will spread more greatly than a difference of an up spin electron expected only from a viewpoint of simple DOS, and a down spin electron.

Since a difference of the Fermi speed of an up spin electron and a down spin electron will be effective as a difference of the second power if it is converted into conduction, it appears as a very big effect (I. I. Main, Phys. Rev. Lett., 83 (7), 1999, p1427). When this effect is taken into consideration, it turns out that a difference of DOS of an up spin electron and a down spin electron near the Fermi level does not necessarily need to be close to 100%. In other wards, a definition of a half metal from a viewpoint of the conventional DOS is a sufficient condition, but if it thinks from a viewpoint of electronic conduction, it is nor a necessary condition. By taking a difference of the electronic Fermi speed into consideration, it becomes a necessary condition.

However, material search of the half metal characteristic on band calculation taken into consideration to the Fermi speed was not made at all. Even if taken into consideration to a difference of the Fermi speed of an up spin and a down spin, in material which shows the conventional high Tc, a half metal nature as conduction was not realized. MR rate of change in alloy material which used as a base simple iron (Fe), cobalt (Co), and nickel (nickel) investigated so far was remarkably lower than MR rate of change which should be realized by half metal. That is, in a spin valve element using material which used the conventional high Tc ferromagnetism material as a base, a certain means to change the Fermi speed was not considered at all.

On the other hand, the inventors noted that the Fermi speed also originated in band structure of a crystal deeply. And it was discovered that conduction half metal nature was realized by producing band modulation in a magnetic material layer which used high Tc material as a base. Here, if an oxide or a nitride, oxinitride, phosphide, and fluoride are used, band modulation can be effectively produced by using very small quantity of them. Then, in order to acquire the band modulation effect, a very thin oxide layer TB by such material was invented.

In order not to raise resistance of an element, it must be made for these very thin oxide layer TB to have to bring about the band modulation effect in the sufficiently thin state. Progress of film formation technology in recent years can realize now creation of an artificial lattice of an oxide layer of such a very thin, or a nitride layer. When thought only on the conventional film formation technical level, such an artificial lattice was what cannot be realized at all. This is also the cause as which an artificial substance which inserted a very thin oxide layer of such was not devised. An inventors was able to establish technology which forms an oxide layer of a very thin into a magnetic material, and was able to result in a the invention based on a result that these artificial substances' being formed and a rate of spin polarization change a lot.

As an effect of a very thin oxide layer TB in the invention, as explained above, as expressed in FIG. 2B, 100% polarization of DOS must not necessarily be realized and an effect which a difference produces at the Fermi speed should just be acquired. The Fermi speed of an up spin electron and a down spin electron is determined by situation of a Fermi surface. Therefore, if band structure changes with very thin oxide layers TB, these Fermi speed will also change.

As explained above, in the invention, the band modulation effect is acquired by inserting a very thin oxide layer TB. This very thin oxide layer TB can be formed with an oxide, a nitride, an oxinitride, the phosphide, or fluoride.

Here, the very thin oxide layer TB in the invention differs from a filter layer for resistance adjustment which is provided for mere "current constriction (CCP (Current Confined Path)) in respects of a function and a physical principle.

Such a filter layer for resistance adjustment has pinholes of a certain rate. That is, it is the oxide layer (or a nitride layer, a fluoride layer) which is not uniform. On the other hand, a very thin oxide layer TB of the invention has low resistance itself, or hardly causes a resistance rise for sufficiently thin thickness. It does not have a role to adjust resistance with the ratio or area of pinholes, etc. In the invention, it is not so preferred from a viewpoint of band modulation that deviation of a current path comes out. As for a very thin oxide layer TB in the invention, it is preferred that it is the uniform oxide layer (or a nitride layer, a fluoride layer) which does not have pinholes.

Here, a "uniform" oxide layer shall mean that a pinhole average diameter is less than 20% to the sum of thickness of a free layer, a non-magnetic spacer layer, and a pinned layer. As the measuring method, the TEM (transmission electron microscope) observation can be used, for example. As the manufacture method to form a uniform very thin oxide layer TB, the ion beam oxidizing method, a plasma oxidation method, the radical oxidizing method, a high energy oxidization method using a gas cluster ion beam, etc. can be used as will be mentioned later.

As for mean thickness of a very thin oxide layer TB, it is preferred that it is the range of 0.2 nm-3 nm. Here, "mean thickness" is the average value when observing five points at intervals of 5 nm toward the direction of a film plane. A sectional TEM photograph of an element etc. can be used for this measurement. A definition about This "mean thickness" shall be the same for each layer, such as non-magnetic layer NM, as will explained in full detail behind.

As the very thin oxide layer TB, if a layer made of oxide, nitride, oxinitride, phosphide or fluoride of thickness of an about 0.2 nm is provided, sufficient effect will be obtained depending on selection of a proper material. By insertion of a uniform very thin oxide layer TB, since current flows uniformly, the spin filtering effect can also be expected.

Figure 3A:
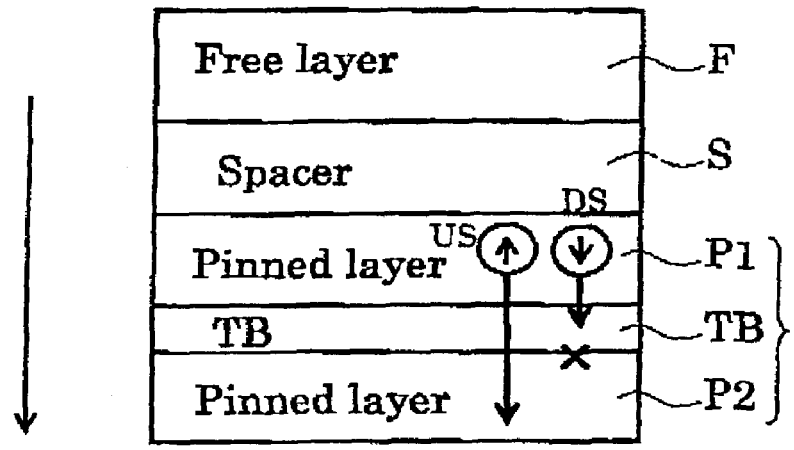
FIGS. 3A through 3C are conceptual diagrams for explaining a difference between a physical principle of CCP, and a physical principle of spin filtering by a very thin oxide layer TB of the invention.
Figure 3B:
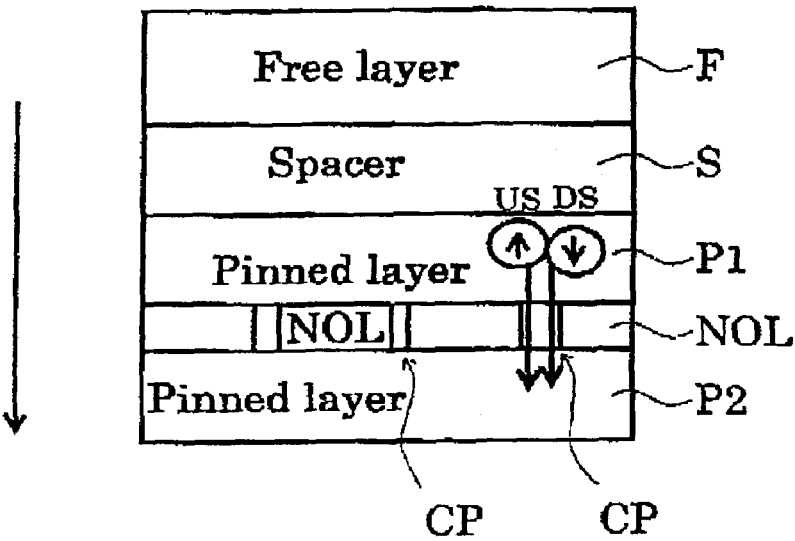
Figure 3C:
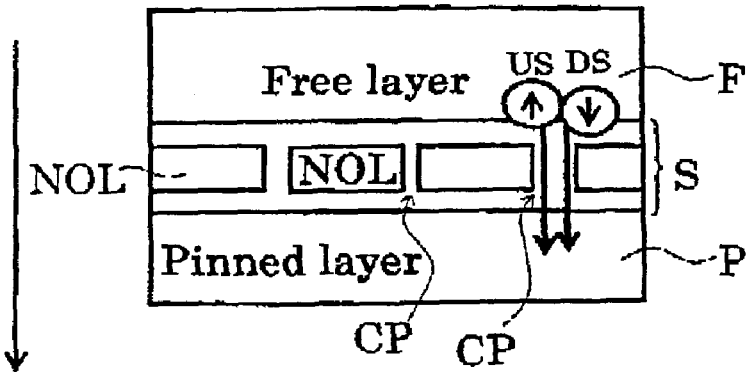

FIGS. 3A through 3C are conceptual diagrams for explaining a difference between a physical principle of CCP, and a physical principle of spin altering by a very thin oxide layer TB of the invention.

FIG. 3A shows a case where a very thin oxide layer TB is inserted in a pinned layer P in the embodiment. FIG. 3B shows the structure where an oxide layer for CCP is inserted in a pinned layer P, and FIG. 3C shows the structure where an oxide layer for CCP is inserted in a spacer layer S.

As shown in FIGS. 3B and 3C, since the oxide layer for CCP is provided for a current constriction and for a filter for resistance adjustment, the thin current path CP is provided in the oxide layer. When electrons pass the current path CP intermittently provided into the oxide layer, both an up spin electron US and a down spin DS pass the current path CP. That is, a spin dependence effect is not produced, in this case, a rise of MR rate of change is acquired according to an effect of the current constriction.

For this current constriction purpose, the oxide layers for CCP are divided into portions which passes current, and portions which block current, as shown in the figures.

On the other hand, in the case of a very thin oxide layer TB by the embodiment, the electronic spin filtering effect arises according to the band modulation effect. That is, the spin-depending conduction characteristic for which a down spin electrons DS are hard to pass although the up spin electrons US easily pass, is obtained.

A large MR rate of change can be obtained according to an effect of spin filtering, without raising resistance.

Hereafter, the embodiment of the invention will be explained, referring to the drawings.

In a the invention, as expressed in FIG. 1, by inserting a very thin oxide layer TB, a state of a pinned layer P and/or a free layer F can be changed, and high MR rate of change and a high output signal can be realized. The very thin oxide layer TB can be inserted in the pinned layer and/or in the free layer and/or at the interfaces between these layers and the spacer layer.

In the invention, a non-magnetic layer of a very thin may be inserted between the very thin oxide layer TB and the ferromagnetic layer.

Figure 4:
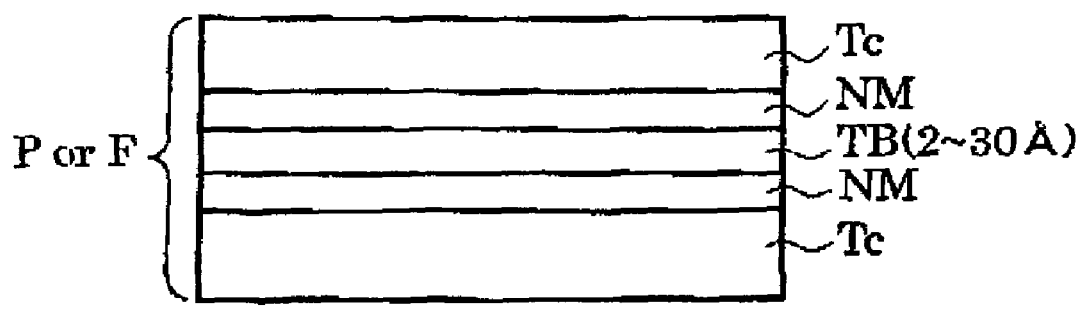
FIG. 4 is a principal part sectional view showing structure where a non-magnetic layer NM is provided in the upper and lower sides of the very thin oxide layer TB.

FIG. 4 is a principal part sectional view showing structure where a non-magnetic layer NM is provided in the upper and lower sides of the very thin oxide layer TB. That is, this figure expresses structure where a very thin oxide layer TB is inserted into the pinned layer P or the free layer F, and a very thin non-magnetic layer NM is further inserted for both the upper and lower sides thereof.

Since thickness of this non-magnetic layer NM is thin enough, upper and lower parts of the ferromagnetic layer P (F) are magnetically coupled by sufficient strength via the very thin oxide layer TB and the non-magnetic layer NM. A form of this magnetic coupling may be a ferromagnetic coupling or a antiferromagnetic coupling. And in order to obtain sufficient magnetic coupling of upper and lower parts of the ferromagnetic layer P (F), the very thin oxide layer TB and the non-magnetic layer NM need to be both sufficiently thin. When the band modulation effect is aimed at, sufficient effect can be acquired even if the non-magnetic layer is made very thin. Mean thickness of a very thin oxide layer TB is preferably from about 0.2 nm to 3 nm. In order to prevent a degradation of the magnetic coupling between magnetic layers of the upper and lower sides, as for thickness of the non-magnetic layer NM, it is still more desirable that it is from about 0.2 nm to 1 nm.

As for sum total thickness of a very thin oxide layer TB and a non-magnetic layer NM, it is desirable from 0.4 nm to 3 nm, and more desirably from 0.4 nm to 2 nm. The reason is that magnetic coupling of the magnetic layers of the upper and lower sides through the non-magnetic layer and the very thin oxide layer will become weak if thickness of the non-magnetic NM becomes thick. That is, a non-magnetic layer NM in the embodiment is not aiming at an effect as a barrier layer for making oxygen of a very thin oxide layer not touch a magnetic layer from a viewpoint of soft magnetism etc.

Material which is later mentioned about Table 5 as a material of a very thin oxide layer TB is desirable. As a material of the non-magnetic layer NM, aluminum (Al), copper (Cu), gold (Au), silver (Ag), ruthenium (Ru), rhodium (Rh), iridium (Ir), rhenium (Re), titanium (Ti), vanadium (V), chromium (Cr), manganese (Mn), magnesium (Mg), tantalum (Ta), tungsten (W), or hafnium (Hf) is desirable, and it is especially desirable to use copper (Cu), gold (Au), or silver (Ag).

Insertion of a non-magnetic metal layer NM of these very thins provides a metal layer other than a ferromagnetic layer in a thin oxide layer TB interface. Therefore, the way of contribution of the band modulation effect changes and the spin filtering effect becomes strong.

A loss of a spin memory of electrons which flow in a very thin oxide layer TB from ferromagnetic layer P (F) etc. can be controlled by inserting a non-magnetic metal layer NM.

In any case, it becomes possible by providing a non-magnetic layer NM to enlarge further the increase effect of MR rate of change by a very thin oxide layer TB.

Figure 5:
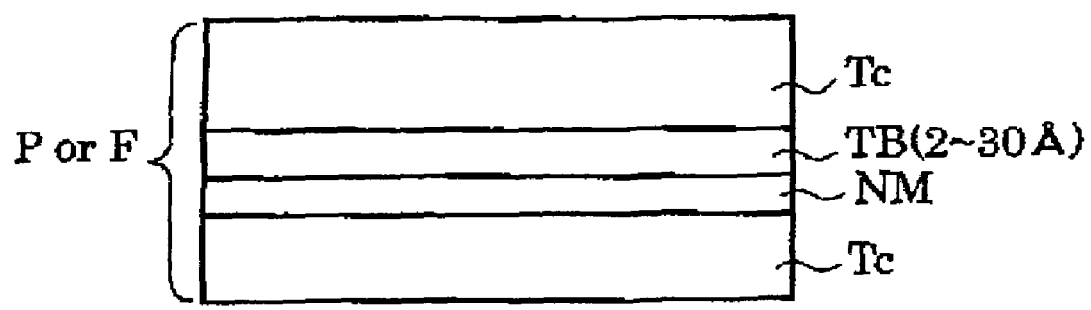
FIG. 5 is a principal part sectional view which expresses a modification of structure expressed to FIG. 4, and expresses structure where a non-magnetic layer NM of a very thin is inserted only in one side among the upper and lower sides of a very thin oxide layer TB.

FIG. 5 is a principal part sectional view which expresses a modification of structure expressed to FIG. 4, and expresses structure where a non-magnetic layer NM of a very thin is inserted only in one side among the upper and lower sides of a very thin oxide layer TB. Also in this example of transformation, it may be the same as that of what was mentioned above about FIG. 4 about material, thickness, etc. of a veer thin oxide layer TB and a very thin non-magnetic layer NM.

Figure 6:
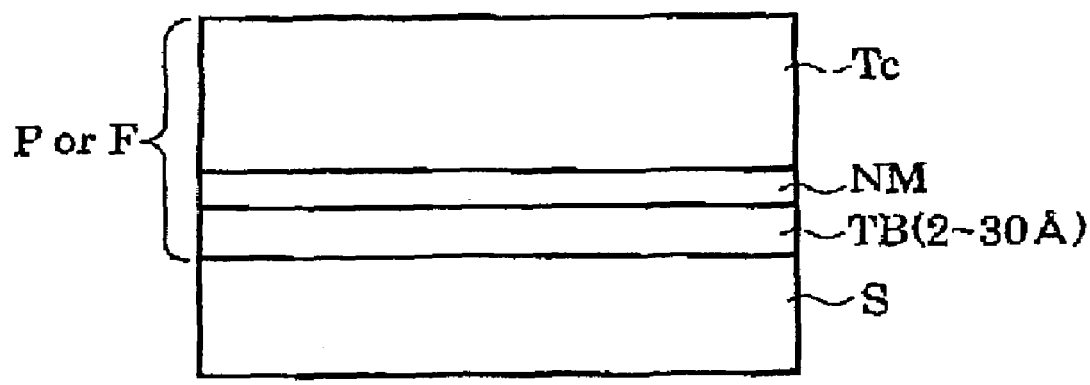
FIG. 6 expresses a case where a very thin oxide layer TB is inserted in an interface of a pinned layer P (or a free layer F) and a spacer layer S.

FIG. 6 expresses a case where a very thin oxide layer TB is inserted in an interface of a pinned layer P (or a free layer F) and a spacer layer S. Also in this case, a non-magnetic layer NM of a very thin can be provided between a very thin oxide layer TB and a pinned layer P (a free layer F). About the function, it is the same as that of what was mentioned above about FIGS. 4 and 5.

Figure 7:
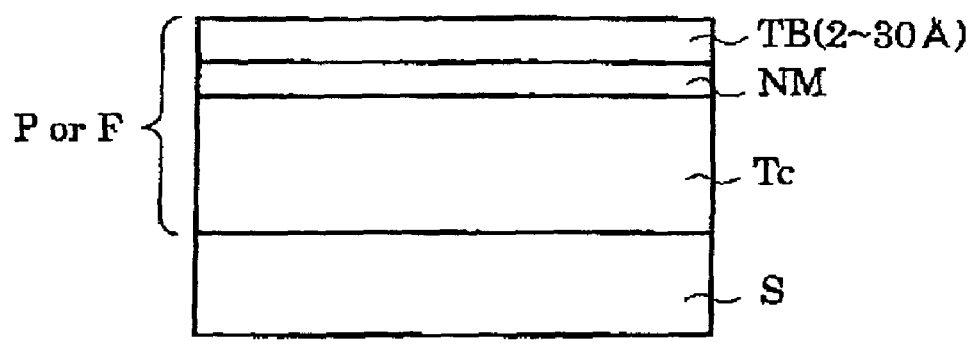
FIG. 7 is a schematic diagram showing a structure where a very thin oxide layer TB is provided in the opposite side of a pinned layer P (or a free layer F) from the spacer layer S.

FIG. 7 is a schematic diagram showing a structure where a very thin oxide layer 113 is provided in the opposite side of a pinned layer P (or a free layer F) from the spacer layer S. It is the same as that of what mentioned above about FIGS. 4 and 5 about that function also in this structure. In this case, since a magnetic layer does not necessarily exist via a non-magnetic layer NM and a very thin oxide layer TB, the magnetic coupling between the upper and lower sides do not need to be cared about. However, from a viewpoint of the band modulation effect, the desirable thickness range of a non-magnetic layer NM and a very thin oxide layer TB is the same as that of what has so far been shown.

In order to acquire an effect of the invention fully, the structure where a very thin oxide layer exists in a magnetic layer film, or the structure where a very thin oxide layer exists in an interface with a spacer layer as shown in FIGS. 4 through 6 is more preferable than the structure of FIG. 7 where a very thin oxide layer exists in a position most distant from the spacer layer S. Structures shown in FIGS. 3 through 10 mentioned later are also more preferred than a structure shown in FIG. 11 by same reason. For example, as for a very thin oxide layer, it is desirable to be located within 3 nm from a non-magnetic spacer layer.

Moreover, the same effect is acquired by inserting the very thin oxide layer in a pin layer or a free layer. It is more effective to insert in a pin layer at this time than to insert in a free layer. That is because the magnetization response of the free layer may fall on device operation, when the very thin oxide layer is inserted in the interface or the inside of the free layer. In particular, this poses an essential problem, when providing the very thin non-magnetic layer NM in addition to the very thin oxide layer TB. And it becomes difficult to use it in ʊand a free layer.

FIGS. 8 through 11 are principal part sectional views which illustrate structures where a metal magnetic layer FM is further provided between a very thin non-magnetic layer NM and a very thin oxide layer TB.

Figure 8:
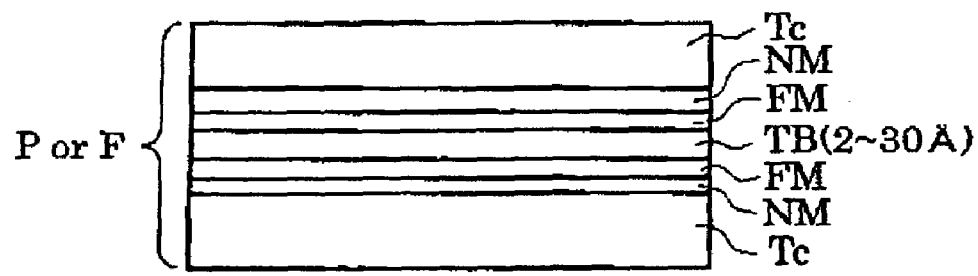
FIG. 8 expresses structure where a very thin oxide layer TB was inserted into a pinned layer P (or a free layer F)

First, FIG. 8 expresses structure where a very thin oxide layer TB was inserted into a pinned layer P (or a free layer F). And a metal magnetic layer FM is laminated at the upper and lower sides of a very thin oxide layer TB, and a ferromagnetic layer is further laminated at the outside via a very thin non-magnetic layer. By providing such a magnetic layer FM, as mentioned above about FIG. 4, material which adjoins a very thin oxide layer TB is made to be changed suitably, and the band modulation effect of a very thin oxide layer TB can be emphasized.

In the case of this example, by inserting a metal magnetic layer FM, a magnetic effect in inside of a very thin oxide layer TB is assisted, and an effect which promotes magnetic coupling of a pinned layer P of the upper and lower sides through a very thin oxide layer TB (a free layer F) is acquired.

On the other hand, when a very thin oxide layer TB is formed by self-oxidization (or a self-nitride, self-fluoridation, etc.) of a metal layer, this metal magnetic layer FM may correspond to a portion which remained as that non-oxidized portion. In such a case, a laminated structure of a very thin oxide layer TB and a metal magnetic layer FM can be formed, keeping good the adjustment of an interface of a very thin oxide layer TB and a metal layer FM.

Figure 9:
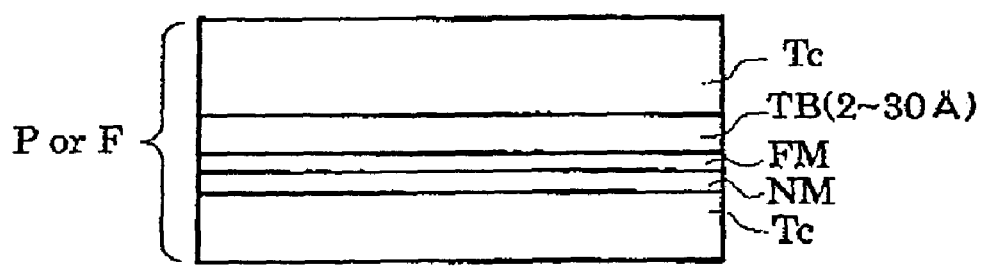
FIG. 9 is a schematic diagram showing structure where a very thin non-magnetic layer NM and a metal magnetic layer FM are provided only in one of the upper and lower sides of a very thin oxide layer TB.

Next, FIG. 9 is a schematic diagram showing structure where a very thin non-magnetic layer NM and a metal magnetic layer FM are provided only in one of the upper and lower sides of a very thin oxide layer TB. That is, a very thin oxide layer TB is inserted into a pinned layer P (or a free layer F), and a metal magnetic layer FM and a non-magnetic layer NM are laminated at the bottom. Also in this case, an effect mentioned above about FIGS. 4 through FIG. 8 is acquired.

Figure 10:
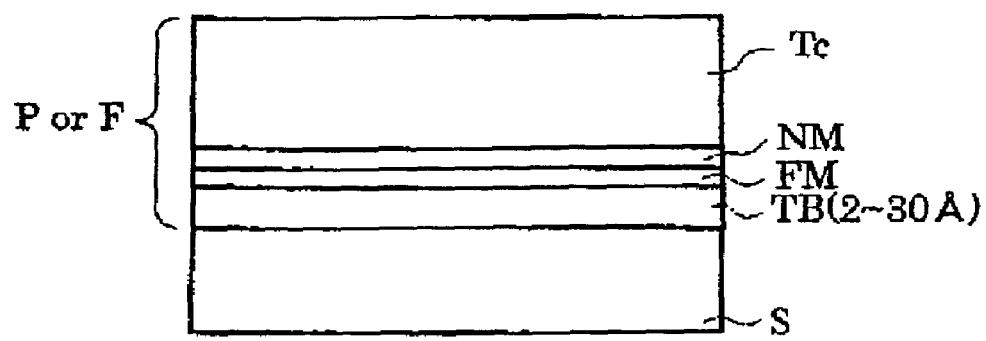
FIG. 10 illustrates structure where a very thin oxide layer TB is inserted in an interface of a pinned layer P (or a free layer F) and a spacer layer S.

FIG. 10 illustrates structure where a very thin oxide layer TB is inserted in an interface of a pinned layer P (or a free layer F) and a spacer Layer S. That is, the same effect as what was mentioned above about FIGS. 4 through 9 is acquired by inserting a metal magnetic layer FM and a non-magnetic layer NM also in this case.

Figure 11:
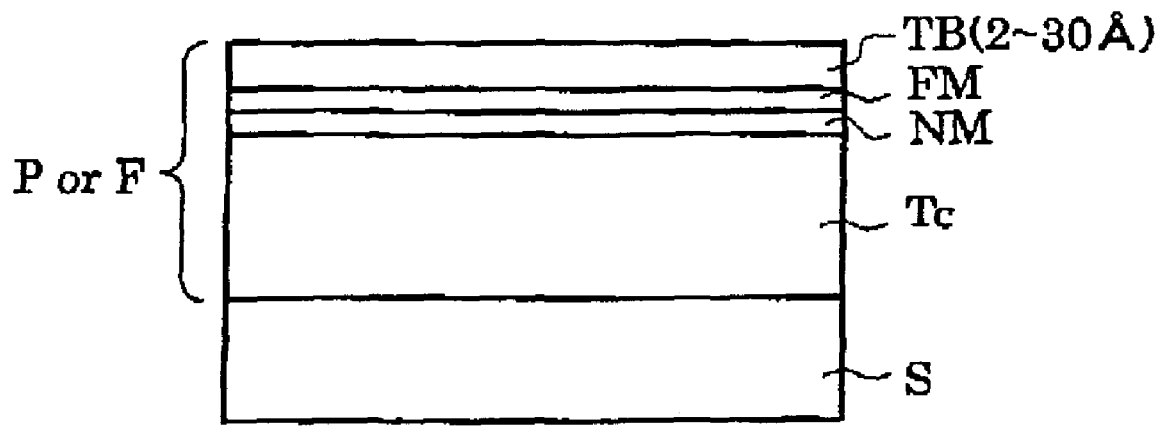
FIG. 11 illustrates structure where a very thin oxide layer TB is inserted in an interface by the side of opposite as a spacer layer S of a pinned layer P (or a free layer F)

FIG. 11 illustrates structure where a very thin oxide layer TB is inserted in an interface by the side of opposite as a spacer layer S of a pinned layer P (or a free layer F). The same effect as what was mentioned above about FIGS. 4 through 9 is acquired by inserting a metal magnetism layer FM and a non-magnetic layer NM also in this case. In this case, since a magnetic layer does not necessarily exist via a non-magnetic layer NM and a very thin oxide layer TB, magnetic coupling between the upper and lower sides do not need to be cared about. However, from a viewpoint of the band modulation effect, the desirable thickness ranges of a non-magnetic layer NM and a very thin oxide layer TB are the same as that of what has so far been shown.

On the other hand, although it is preferred that it is a uniform oxide film as for a very thin oxide layer TB used in the embodiment. However, it is not limited to this, and the oxide layer TB may not oxidized completely. This is the same in the case of most fundamental structure that does not contain a very thin non-magnetic layer NM as illustrated in FIG. 1.

Figure 12:
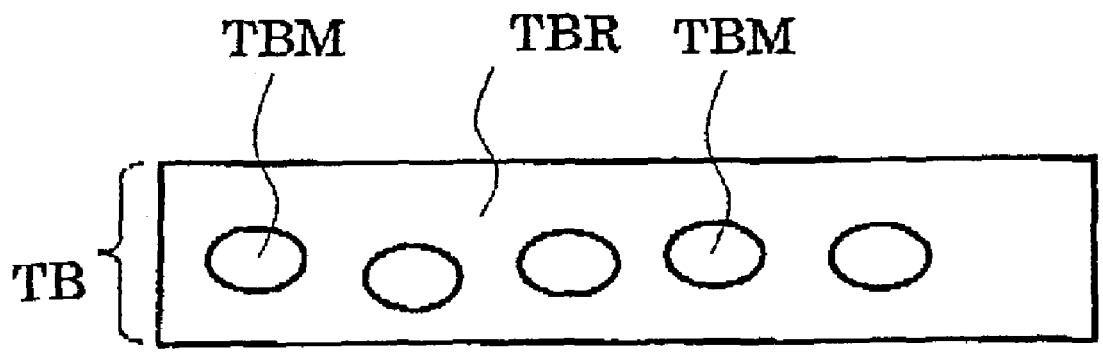
FIG. 12 is a schematic diagram showing a case where portions being unreacted (un-oxidized, un-nitrided, non-fluoridated) are contained in a very thin oxide layer TB.

FIG. 12 is a schematic diagram showing a case where portions being unreacted (un-oxidized, un-nitrided, non-fluoridated) are contained in a very thin oxide layer TB. That is, in the case of an example of this figure, a very thin oxide layer TB has a reacted portion TBR in where metal have reacted (oxidization, a nitride, fluoration, etc.), and a portions TBM where metal etc. remains in the unreacted state. The unreacted portions TBM may exist in the form of a cluster, or in the form of granular, as illustrated in FIG. 12.

Thus, if the unreacted metal portions TBM are made to remain in a film, resistance of a conduction to pass electrons through the very thin oxide layer TB perpendicularly can be reduced.

When a very thin oxide layer TB consists of oxides (or a nitride, fluoride, etc.) of a magnetic element, those which remain in a film as unreacted metallic elements (TBM) is a magnetic element. In this case, it is effective in maintaining magnetism in a very thin oxide layer TB, and an effect of helping magnetic coupling of a magnetic layers of the upper and lower sides through a very thin oxide layer TB is acquired.

When metallic elements remain, current tends to flow the unreacted portions TBM preferentially. In this case, if the remaining metal element is a magnetic metal which is surrounded by the reacted portion TBR, increase of the spin filtering effect may arise, and MR rate of change may increase further.

As magnetic metallic elements which are easy to remain in the unreacted state in the very thin oxide layer TB, iron (Fe), cobalt (Co), nickel (nickel), etc. can be mentioned. Especially among these, since cobalt (Co) cannot oxidize most easily, in forming a very thin oxide layer TB by oxidation reaction, cobalt (Co) tends to remain in an unreacted metal state. As an element which constitutes a part for such an unreacted metal portions TBM, non-magnetic metallic elements, such as copper (Cu), gold (Au), silver (Ag), a ruthenium (Ru), rhodium (Rh), and rhenium (Re), can also be mentioned.

Figure 13:
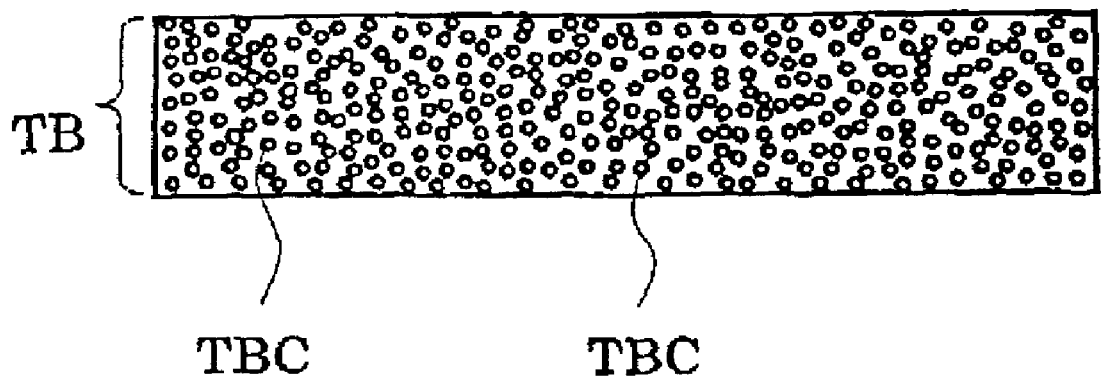
FIG. 13 is a schematic diagram showing a case where unreacted metallic elements exist uniformly in a very thin oxide layer TB as the form not of granular but a more detailed cluster TBC.

FIG. 13 is a schematic diagram showing a case where unreacted metallic elements exist uniformly in a very thin oxide layer TB as the form not of granular but a more detailed cluster TBC. Thus, also when unreacted metallic elements are uniformly distributed in a very thin oxide layer TB by the shape of a detailed cluster, an effect homogeneous as what was mentioned above about FIG. 12 can also be expected. About a kind of metallic elements which are easy to form a cluster TBC of an unreacted state, it is the same as that of what was mentioned above about FIG. 12.

FIGS. 14A through 14D are sectional schematic diagrams which illustrate insertion locations of a very thin oxide layer TB. That is, FIG. 4A and 4C express examples where a very thin oxide layer TB is inserted near the interface with a spacer layer S of a free layer F or a pinned layer P, respectively. In this case, spin-dependent interface scattering will contribute to improvement in MR rate of change greatly. By providing a very thin oxide layer TB, band structure of a magnetic layer F (or P) which is in contact with a spacer layer S changes. And when an electron which contributes to conduction carries out spin polarization greatly to either a up or a down state, MR rate of change improves.

When based on interface scattering, effect for a ferromagnetic layer F (or P) which is in contact with a spacer layer S with the sufficient band modulation effect by a very thin oxide layer TB must be given. For this reason, as for thickness T of a ferromagnetic layer between a very thin oxide layer TB and a spacer layer S, it is preferred not to become not much thick. When thickness T is 1 nm or less, the "interface effect" is acquired near the interface with a spacer layer S which is expressed in FIGS. 14A through 4D. On the other hand, when it is inserted in an inside of a magnetic layer, the "bulk scattering effect" is acquired as will be explained later with reference to FIG. 16.

Figure 14A:
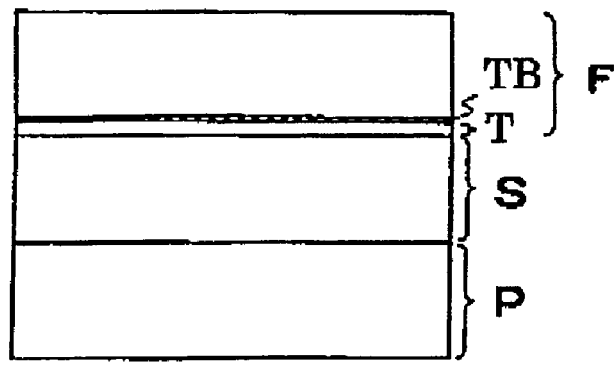
FIGS. 14A through 14D are sectional schematic diagrams which illustrate insertion locations of a very thin oxide layer TB.
Figure 14B:
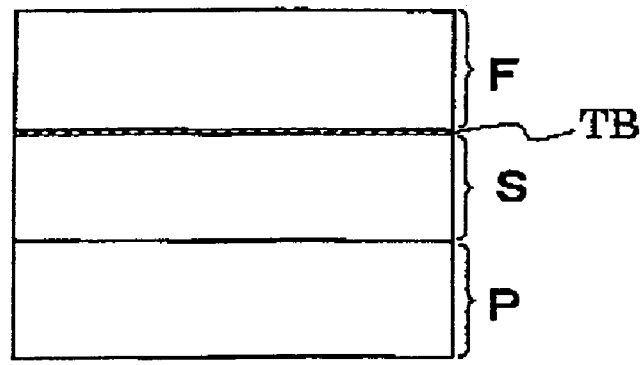
Figure 14C:
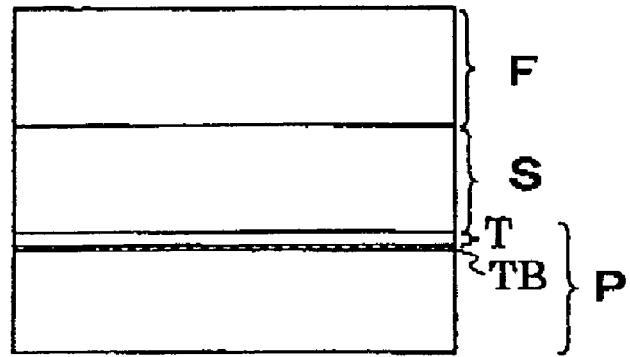
Figure 14D:
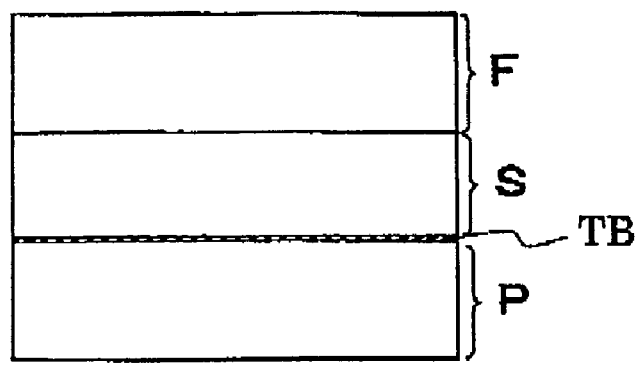
Figure 15A:
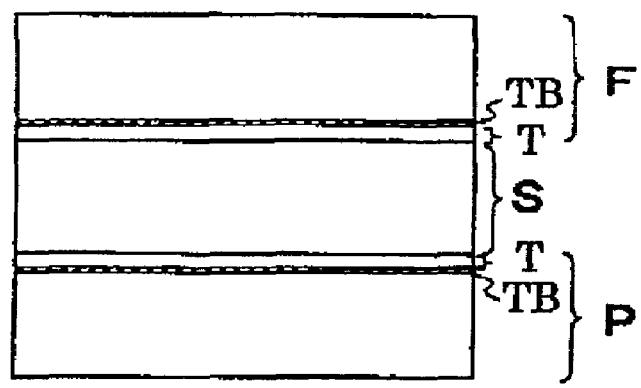
FIGS. 15A through 15D are schematic diagrams which illustrate structures where a very thin oxide layer TB is inserted in both pinned layer P and free layer F.
Figure 15B:
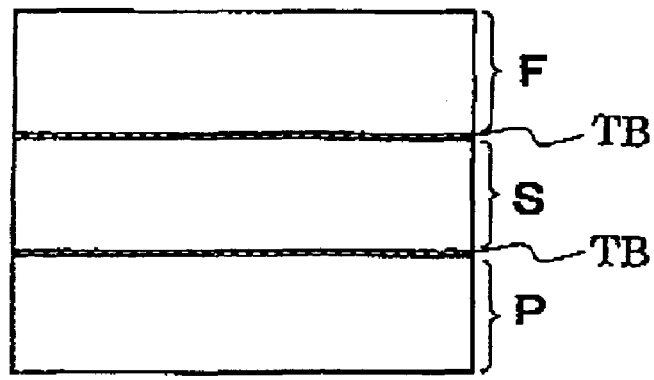
Figure 15C:
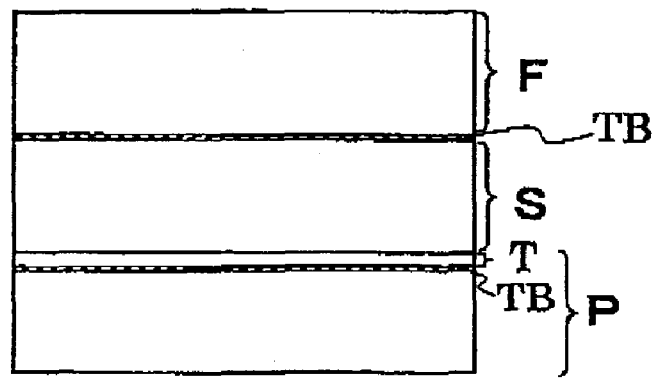
Figure 15D:
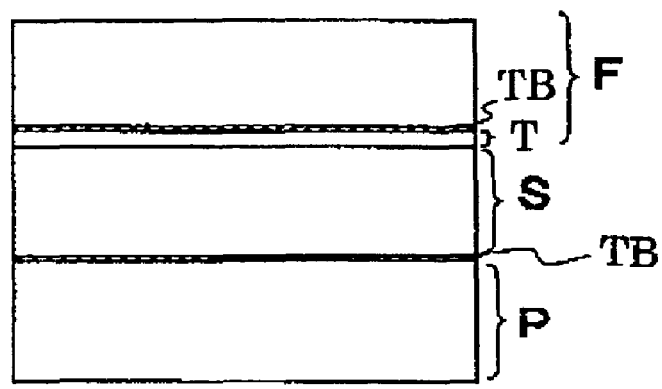

As the thinnest limit, the structures where the very thin oxide layer TB is inserted in an interface of a pinned layer P or a free layer F, and a spacer layer S, are shown in FIGS. 14B and 14D, as cases of thickness T of 0 nm. An effect which modulates the band structure of not only the pinned layer P and/or the free layer F but also the spacer layer S can be obtained in these cases, and the modulation effect may become more remarkable depending on material of the spacer layer S.

FIGS. 15A through 15D are schematic diagrams which illustrate structures where a very thin oxide layer TB is inserted in both pinned layer P and free layer F. Since the interface effect by band modulation arises in two locations in the element in the case of these examples, the rise effect of MR rate of change will improve further.

A very thin oxide layer TB may be inserted not only at the interface of a pinned layer P or a free layer F, and a spacer layer S but also inside of the pinned layer P or the free layer F. Thus, a half metal nature inside the pinned layer P and/or the free layer F may be emphasized.

FIGS. 16A through 16D arc schematic diagrams showing examples where a very thin oxide layer TB is inserted in an inside of a pinned layer P or a free layer F.

Figure 16A:
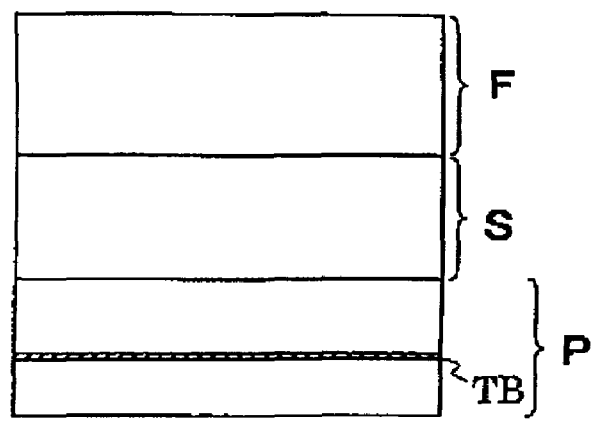
FIGS. 16A through 16D are schematic diagrams showing examples where a very thin oxide layer TB is inserted in an inside of a pinned layer P or a free layer F.
Figure 16B:
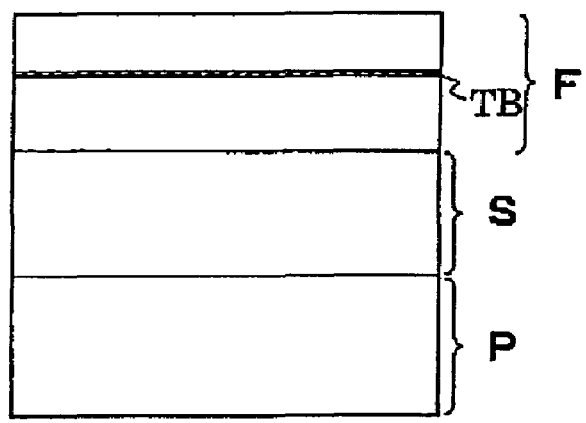

That is, FIGS. 16A and 16B express examples where a very thin oxide layer TB is inserted in an inside of a pinned layer P or a free layer F.

In this case, it is possible to produce the spin dependence bulk scattering effect inside a pinned layer P or a free layer F. In order to pull out this effect still more notably, a two or more very thin oxide layer TB can be inserted into the magnetic layer.

Figure 16C:
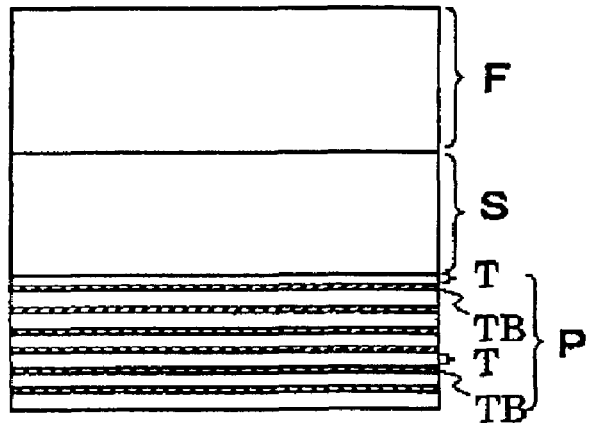
Figure 16D:
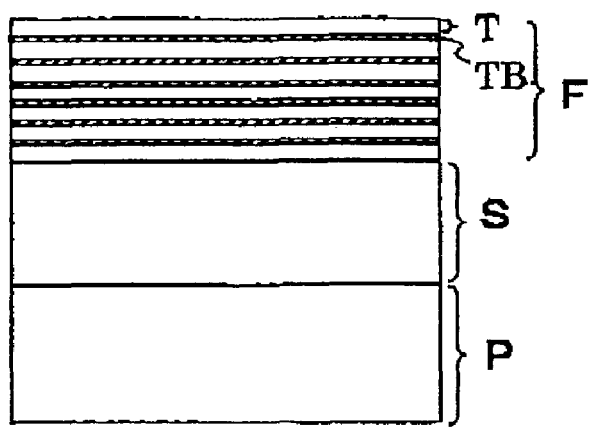
Figure 17A:
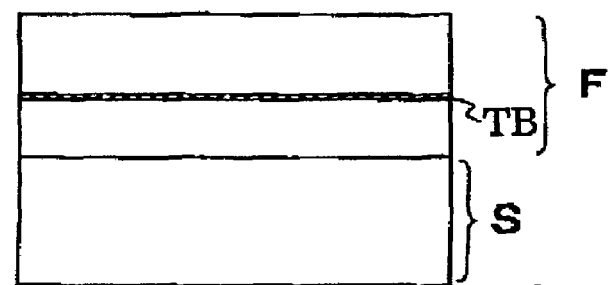
FIGS. 17A through 17D show the structures where the very thin oxide layers TB are inserted in both a pinned layer P and a free layer F.
Figure 17B:
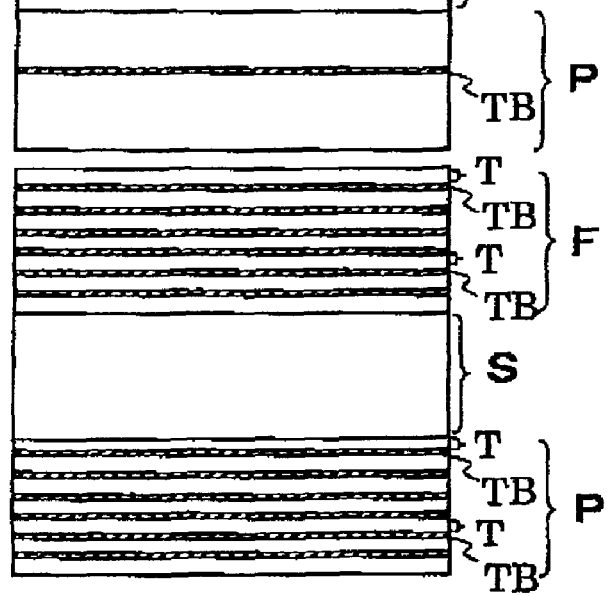
Figure 17C:
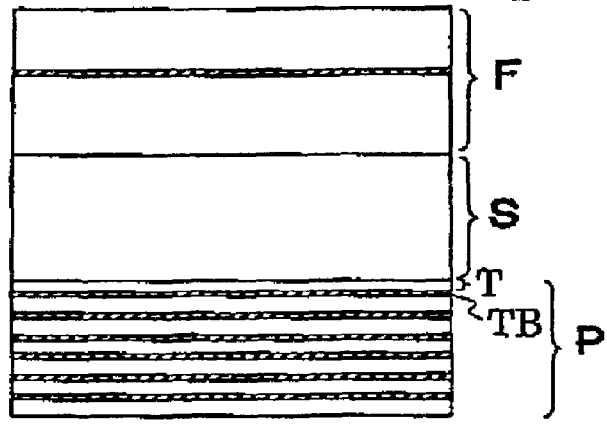
Figure 17D:
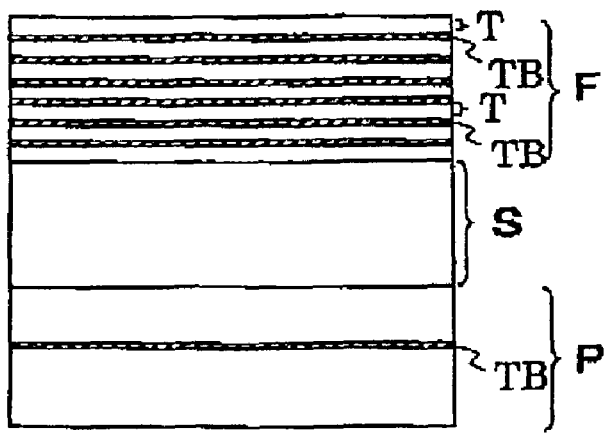

FIGS. 16C and 16D express examples where two or more very thin oxide layers TB are inserted in this way. In this case, it is desirable to insert in the ferromagnetic layers by making an interval of very thin oxide layers TB into about 0.2 nm to 3 nm. Since band structure will change with the interval and the period of the very thin oxide layers TB, half metal nature, i.e., MR rate of change, will change. Any number of laminations of the very thin oxide layers TB in a pinned layer P and a free layer F may be adopted. Actually, about two layers to fifteen layers are desirable.

As illustrated in FIGS. 17A through 17D, when the very thin oxide layers TB are inserted in both a pinned layer P and a free layer F, an effect of half metal nature improves further.

As illustrated in FIGS. 18A through 18D, the very thin oxide layers TB may be provided in both inside the bulk and near the interface in a pinned layer P or a free layer F.

In this case, the spin-dependent interface scattering effect (FIGS. 14 and 15) in a spacer layer interface , and the spin-dependent bulk scattering effect (FIGS. 16 and 17) inside a pinned layer P or free layer F, are both acquired, and even higher MR rate of change can be expected.

Supposing half metal nature in an interface is in a perfect ideal state, scattering of either an up spin electron or a down spin electron will be carried out 100% (all) by the interface. Therefore, combination with the bulk scattering effect should not have a meaning. However, it is difficult to realize a completely ideal state with an actual element in many cases. Therefore, the further improvement in MR rate of change can be desired by the addition of half metal nature within the bulk.

FIGS. 18A through 18D express element structures of a pinned layer P or a free layer F which is for acquiring interface dependence scattering and the bulk scattering effect only in one side either.

On the other hand, FIGS. 19A through 19D show the structures where two or more very thin oxide layers TB are inserted in either a pinned layer P or a free layer F, in order to aim at interface dependence scattering and the bulk scattering effect, and to reinforce the bulk scattering effect.

Figure 20A:
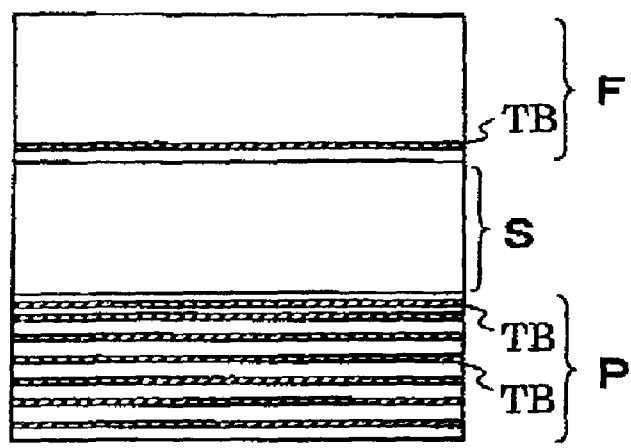
FIGS. 20A through 20D express element structures which aimed at the interface scattering effect in either a pinned layer P or a free layer F, and aimed at the bulk scattering effect by two or more very thin oxide layers TB in a layer of another side.
Figure 20B:
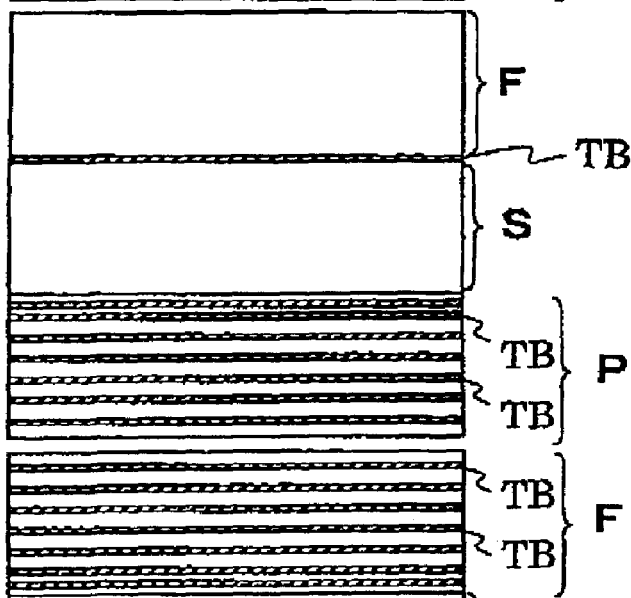
Figure 20C:
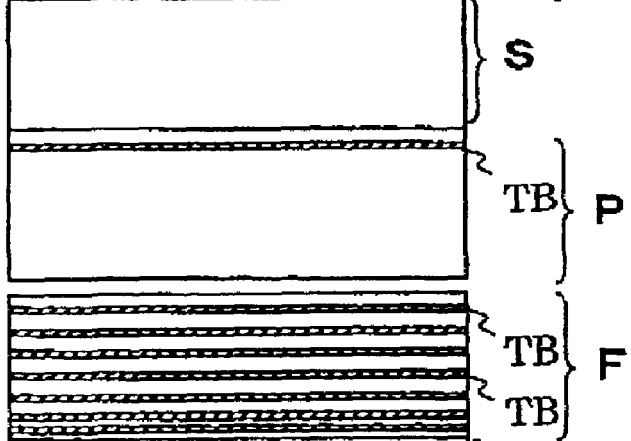
Figure 20D:
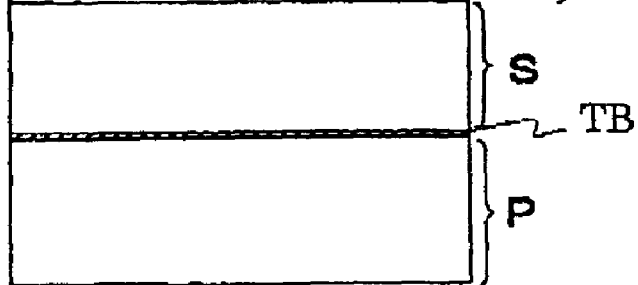
Figure 21A:
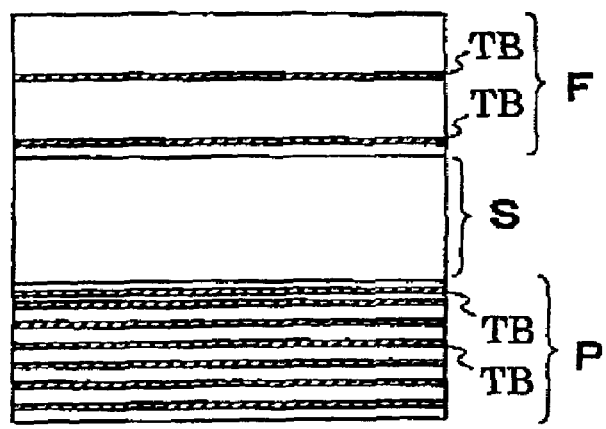
FIGS. 21A through 21D illustrate further structures where two or more very thin oxide layers TB are inserted in order to aim at both the interface scattering effect and the bulk scattering effect also in either a pinned layer P or a free layer F, and to heighten the bulk scattering effect further in one of layers.
Figure 21B:
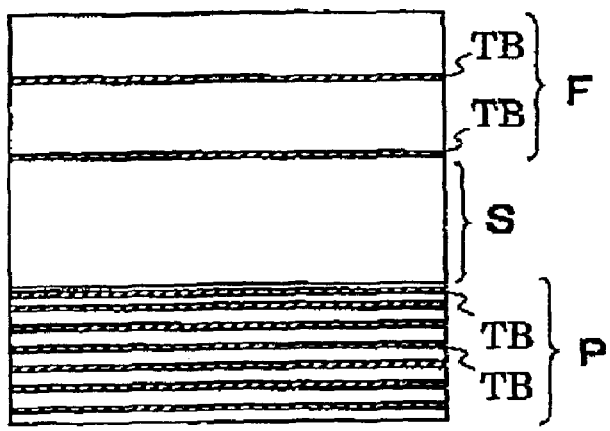
Figure 21C:
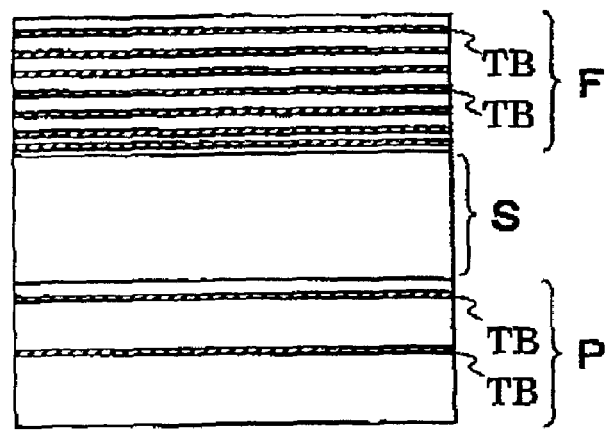
Figure 21D:
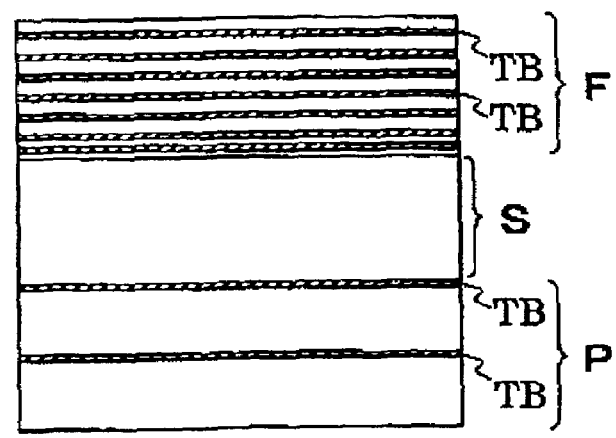

FIGS. 20A through 2D express element structures which aimed at the interface scattering effect in either a pinned layer P or a free layer F, and aimed at the bulk scattering effect by two or more very thin oxide layers TB in a layer of another side.

FIGS. 21A through 21D illustrate further structures where two or more very thin oxide layers TB are inserted in order to aim at both the interface scattering effect and the bulk scattering effect also in either a pinned layer P or a free layer F, and to heighten the bulk scattering effect further in one of layers.

The invention is not limited to combination illustrated in FIGS. 14A through 21D. Based on these views, various combinations where a very thin oxide layer TB is inserted in a pinned layer P and a free layer F can be considered freely.

When providing two or more layers of very thin oxide layers TB, material of these very thin oxide layers may be the same kind, or materials of these layers TB may be mutually different.

Easiest spin valve structures were illustrated in FIGS. 14A through 21D. However, with the application of the invention, the same function effect can be acquired in various kinds of other element structures.

Figure 22A:
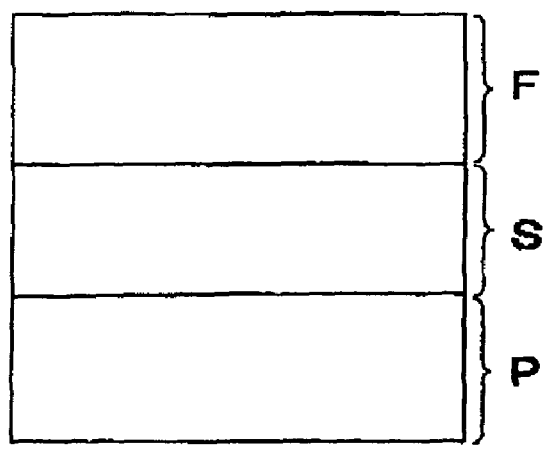
FIGS. 22A through 22C are schematic diagrams which illustrate laminated constitutions of magnetoresistance effect elements which can be used in the invention.
Figure 22B:
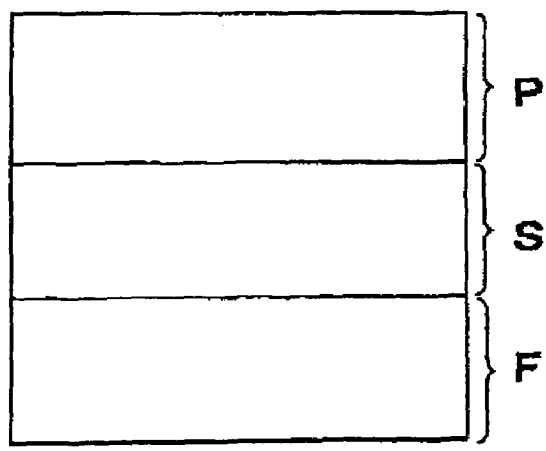
Figure 22C:
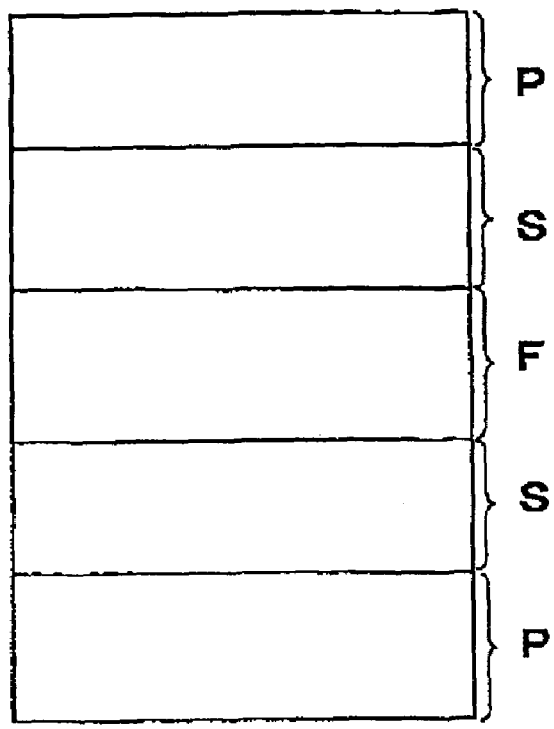

FIGS. 22A through 22C are schematic diagrams which illustrate laminated constitutions of magnetoresistance effect elements which can be used in the invention.

That is, an example expressed in FIG. 22A is the spin valve structure of the so-called "bottom type" where a pinned layer P is provided in the bottom (side near a substrate which is not illustrated).

FIG. 22B is the spin valve structure of the so-called "top type" where a pinned layer P is provided in the top (side far from a substrate which is not illustrated).

FIG. 22C expresses a spin valve structure of the so-called "dual spin valve type" where pinned layers P are provided in the upper and lower sides of a free layer F via a spacer layer S, respectively.

The invention can be applied to any these element structures, and can acquire the same effect. The invention is applicable also to an element of structure like an "artificial lattice type" where three or more layers for example, of spacer layers established besides these, That is, also in these element structures, a function of a very thin oxide layer TB is the same as that of what was illustrated to FIGS. 14A through 21D.

By the way, in spin valve structure, the direction of magnetization of a free layer F changes to an eternal magnetic field. In contrast to this, about a pinned layer P, it is preferable to provide a pinning layer for adhering the magnetization direction of the pinned layer so that the magnetization direction may not change to an external magnetic field.

Figure 23A:
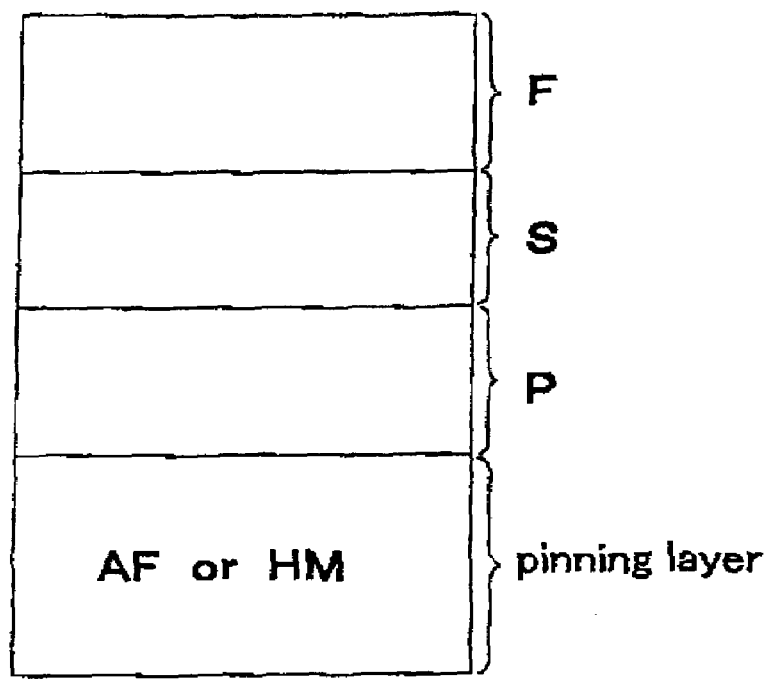
FIGS. 23A and 23B are schematic diadems which illustrate spin valve structures where a pinning layer is provided.
Figure 23B:
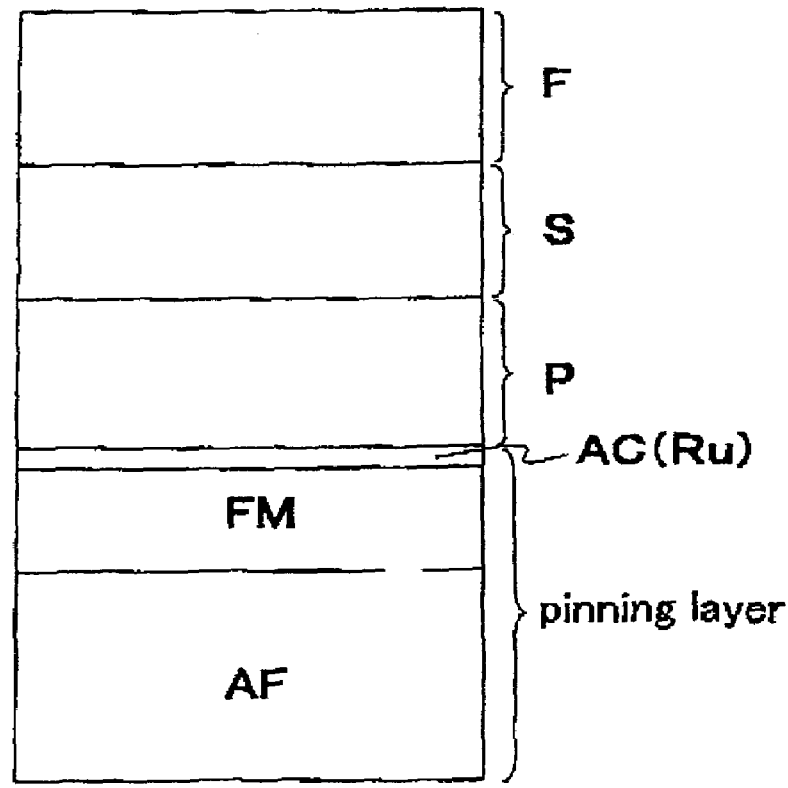

FIGS. 23A and 23B are schematic diagrams which illustrate spin valve structures where a pinning layer is provided. That is, as expressed in FIG. 23A, the magnetization direction of a pinned layer P can be directly adhered with an antiferromagnetic film AF or a hard magnetic film HM. Alternatively, as expressed in FIG. 23B, so-called "synthetic structure" may be adopted.

In synthesizer tick structure, the magnetization of the ferromagnetic layer FM is fixed by the antiferromagnetic film AF, and via the antiferromagnetic coupling film AC which consists of ruthenium (Ru) etc., it is coupled to the pinned layer P in antiferromagnetic fashion, so that the magnetization of the pinned layer p is fixed.

In the invention, any pinning means illustrated in FIGS. 23A and 23B can be used. On the other hand, as a concrete material of a very thin oxide layer TB, an oxide or a nitride which is easy to cause band change greatly can be mentioned. In this case, an oxide layer or a nitride layer containing 3d transition metal which is easy to cause band change is especially preferred as the material of the very thin layer.

Specifically, the oxide, nitride, oxinitride, phosphide, or fluoride of an element, such as calcium (calcium), scandium (Sc), titanium (Ti), vanadium (V), chromium (Cr), manganese (Mn), iron (Fe), cobalt (Co), nickel (nickel), copper (Cu), strontium (Sr), yttrium (Y), barium (Ba), lantern (La), hafnium (Hf), and tungsten (W) can be mentioned. Also except these, an oxide or nitrides of an element such as zinc (Zn), zirconium (Zr), niobium (Nb), molybdenum (Mo), ruthenium (RU), rhodium (Rh), palladium (Pd), tantalum (Ta), iridium (Ir), and platinum (Pt) can also be used.

Except iron oxide ($Fe_3O_4$), all oxides and nitrides of these elements were thought not to show a half metal nature so far.

In the case of iron oxide ($Fe_3O_4$), in order to realize the bulk-characteristic as $Fe_3O_4$ material, thickness more than one unit cell was needed in the state of spinal structure. On the other hand, in the case of an iron oxide, in the invention, it is not necessary to have spinel structure. In the invention, a very thin film of 1 through 5 mono layers (atomic layers) may be sufficient to obtain the effect. At such a thickness range, it is difficult to define the spinel structure. Even if the thickness is larger than 5 mono layers, it may be used as long as the resistance is kept low. Actually, it may be allowable if the thickness of less than 10 mono layers. In order to obtain a lower resistance, it is desirable to make the thickness not exceeding 5 mono layers.

The term "a mono layer (atomic layer)" means the number of existing layers of oxygen, nitrogen, phosphorous and fluoride which exists in the direction of thickness, when the film is observed from the film section. It is defined as average mono thickness by average value of mono layer thickness measured about five points at intervals of film. A sectional TEM of an element can be used as a concrete observation means. If these compounds are crystalline, the atomic layers can be counted on the lattice image of TEM.

Conventionally, an oxide, a nitride, and fluoride with sufficient periodic structure were inserted. On the other hand, in a the invention, it is possible to obtain the effect by using a layer of an oxide, a nitride, a phosphide, or a fluoride whose mean thickness is below 2 unit cell, and even in the case of mean thickness below 1 unit cell, for example.

In the invention, the very thin oxide layer TB itself is not necessarily made to produce half metal nature, as mentioned above. In the invention, a ferromagnetic layer (a pinned layer P or a free layer F) of high Tc which is in contact with a very thin oxide layer TB is made to produce half metal nature. Therefore, in the invention, an effect is acquired by using a very thin layer. When it aims at resistance adjustment or a current constriction, a sufficient effect cannot be acquired by using such a very thin layer.

Since the invention aims at the band modulation effect in a ferromagnetic layer (a pinned layer P, a free layer F), without producing a rise of resistance, the oxide layer (or nitride layer) need to be formed in a sufficient thin thickness which does not bring about the resistance rise effect.

Specifically, the thickness is desirably 0.2 nm to 1 nm. Even if thick, it is 2 nm or less, and it is required to be 3 nm or less as the greatest tolerance level according to material.

Iridium (Ir), platinum (Pt), etc. with a large atomic number tend to produce a spin orbital interaction among elements used as a very thin oxide layer TB. Therefore, since a spin memory loss arises, it is not desirable.

On the other hand, element resistance AR of a CPP element is need to be less than 500 mΩμm2, and preferably lower than 300 mΩμm2, and is the high integration is aimed at, it is preferably lower than 200 mΩμm2. When computing AR from an actual element, AR is computed as a multiplication of an effective area A of a current passing portion of a spin valve film and a resistance R of a CPP element.

Here, element resistance R can be determined by a direct measurement calculation from the magnetoresistance effect element. On the other hand, an effective area A of a current passing portion of a spin valve film is the quantity depending on the shape of the magnetoresistance effect element. For example, when the whole spin valve film is specified as an area which carries out sensing effectually, element area of the whole spin valve film can be specified as an current passing area A of a spin valve film. In this case, element area of a spin valve film should have become equal to or less than 0.09 μm² from a viewpoint of moderate element resistance.

However, area of an electrode which is in contact with the upper and lower sides of a spin valve film prescribes the current passing effective area of a spin valve film, and when the pattering of the spin valve film is not carted out, area of an electrode of the top of bottom may be the current passing area. when areas of the upper and lower electrodes are different, area of an electrode of the smaller one may define the effective area. In this case, element area of a spin valve film should have become also equal to or less than 0.09 μm² from a viewpoint of moderate element resistance.

It may not be easy to determine a strict current passing area depending on the element structure or form of the electrodes. In this specification, a contact area of an electrode of the one where a contact area is smaller is adopted as the current passing effective area A among upper and lower electrodes.

In the invention, 100 ohms or less are realizable as a value of raw resistance R between electrodes of a magnetoresistance effect element. If this is not a magnetoresistance effect element by the invention, it is not easily to realize this resistance. Resistance here is the value of resistance between 2 terminals of an electrode pad reproduction element part of a head which is equipped at the tip of HGA (Head Gimbal Assembly) in the case of a head.

Hereafter, the embodiment of the invention will be explained in more detail referring to the examples.

FIRST EXAMPLE

The magnetoresistance effect element which has the following laminated structure was formed as the first example of the invention.

A lower electrode/tantalum (Ta) 3 nm/nickel iron chromium (NiFeCr) 5 nm/platinum manganese (PtMn) 10 nm/cobalt iron (CoFe) 4 nm/ruthenium (Ru) 0.9 nm/cobalt iron (CoFe) (4 nm/very thin oxide layer 0.5 nm/cobalt iron (CoFe) 1 nm/copper (Cu) 5 nm/cobalt iron (CoFe) 1 nm/nickel iron cobalt (NiFeCo)/copper (Cu) 1 nm /tantalum (Ta) 5 nm/upper electrode.

This example has structure where a very thin oxide layer TB is provided only near the interface with a spacer layer S of a pinned layer P, as shown in FIG. 14C.

In a case of this structure, 100 mΩμm² to 200 mΩμm² is obtained as AR, and 5 mΩμm² to 30 mΩμm² is obtained as AdR. Moreover, if the AR rise effect by the current constriction is combined, 500 mΩμm² may be obtained as AR and 25 mΩμm² to 150 mΩμm² may be obtained as AdR, as will be explained later.

If a very thin oxide layer TB is inserted not only near the interface with a spacer layer S, but also into the pinned layer P and thus, the bulk scattering effect is used, about 1.5 times to 10 times of the above-mentioned value can be obtained. Further, an effect of being 1.5 times to 10 times many is acquired by inserting a very thin oxide layer TB in an interface between a free layer F and a spacer layer S.

Here, tantalum (Ta) 3 mm /nickel iron chromium (NiFeCr) 5 nm are the base layers which served both as the buffer effect and the seed effect. As a material with a buffer effect like tantalum (Ta), titanium (Ti), zirconium (Zr), hafnium (Hf), vanadium (M), chromium (Cr), molybdenum (Mo), tungsten (W), and those alloy material may be used instead of tantalum (Ta).

An oxide or a nitride of such metals may be used. In this case, it is not preferred that resistance goes up as CPP structure. Therefore, in the case of an oxide, it is desirable to make it a very thin layer 2 nm or less. In the case of a nitride, it is desirable to make it a conductive nitride of low resistance, or to make it a very thin layer 2 nm or less, when its resistance is high.

Concentration of chromium (Cr) in nickel iron chromium (NiFeCr) can be made into about 0-40%. fcc metal, hcp metal, etc. can also be used instead of nickel iron chromium (NiFeCr).

For example, copper (Cu), zirconium (Zr), ruthenium (Ru), rhodium (Rh), palladium (Pd), silver (Ag), nickel (nickel), cobalt (Co), platinum (Pt), gold (Au), osmium (Os), rhenium (Re), and those alloy material can be used.

As thickness of these base layers, 3 nm-10 nm or less is desirable. Material with seed effects other than such material can also be used. Since AdR of CPP changes with the crystalline differences arising from a base layer, material selection of a base layer is important, as will be explained in more detail later.

Table 2 shows the examples of a base layer. Here, in the case of the so-called "top type" with which a pinned layer P is provided in the top from a free layer F, a base layer which has an oxide layer for current constriction effect may be used. CPP resistance can be adjusted by constricting the current which flows the so-called spin dependence scattering unit (important unit of three layers which brings about MR change) of a pinned layer P, a spacer layer S, and a free layer F. Simultaneously, though MR rate of change is same level, AdR can be increased by increasing A. When storage density is not so high, it may be used as a means to raise resistance.

Platinum manganese (PtMn) currently formed on a base layer is antiferromagnetic material, and is used to fix the magnetization direction of a magnetic layer formed on it. Instead of platinum manganese (PtMn), a gamma-Mn system antiferromagnetic film of a (manganese Mn) rich system, such as palladium platinum manganese (PdPtMn), iridium manganese (IrMn), and ruthenium rhodium manganese (RuRhMn) may be used. As thickness of this antiferromagnetic layer, 5 nm-20 nm is desirable, and it is still more desirable that it is within a range of 7 nm-15 nm.

The cobalt iron (CoFe) 4 nm/ruthenium (Ru) 0.9 nm/cobalt iron (CoFe) 4 nm/very thin oxide layer 0.5 nm/cobalt iron (CoFe) 1 nm/on the antiferromagnetic layer are pinned layer P. Here, the lower platinum manganise (PtMn) 10 nm/cobalt iron (CoFe) 4 nm/ruthenium (Ru) 0.9 nm are made to call a pinning layer to fix the magnetization of the pinned layer P. In the example, "synthetic structure" where the magnetization directions cancel mutually via a ruthenium (Ru) is adopted.

The so-called "single layer pin structure" where cobalt iron (CoFe) 4 nm/ruthenium (Ru) 0.9 nm is removed is also employable instead of synthetic structure. However, the synthetic structure is more desirable. In the case of synthetic structure, the fixed unidirectional magnetic field is large.

Since the magnetization direction through a ruthenium (Ru) is reverse in the case of synthetic structure, a net magnetic moment which contributes to a disclosure magnetic field to the film exterior is small, and thus it is advantageous on device operation. In the case of synthetic structure, as a magnetic layer between an antiferromagnetic film and a ruthenium (Ru), alloy material, such as iron cobalt (FeCo), nickel iron (NiFe), iron (Fe), cobalt (Co), and nickel (nickel), can be used besides cobalt iron (CoFe).

Moreover, the magnetization adherence method of having used hard ferromagnetism films other than the magnetization adherence direction using an antiferromagnetic film, such as CoPt and CoPtCr, can be used. In this case, a hard ferromagnetic film can be used instead of PtMn. Or a hard ferromagnetic film can be used instead of synthesizer tick structure. When the magnetization is fixed by using a hard ferromagnetic film, the merit that resistance of an element can be lowered is obtained. That is, compared with a metal film of comparatively high resistance like PtMn, CoPt is low resistance. It becomes possible to reduce the excessive resistance between upper and lower electrodes, and MR rate of change can be raised.

In the case of synthetic structure, the thickness of a magnetic layer (here CoFe4) between a ruthenium (Ru) and platinum manganese (PtMn) is desirably to have little asymmetry with magnetic thickness (saturation-magnetization×thickness: Bsxt [T nm]) of the pinned layer P formed on a ruthenium (Ru) (if the magnetic thickness is almost equal). This is because $H_{uaflat}$ can be enlarged.

$H_{uaflat}$ is the size of a magnetic field at which magnetization pinning of a pinned layer can maintain its magnetization, when a magnetic field is impressed to an opposite direction to the magnetization pinned direction of the pinned layer. In this case, magnetization of a free layer is easily suitable in the magnetic field impression direction in a lower field. Therefore, $H_{uaflat}$ may be the strength at which a relation of the magnetization directions of a free layer and a pinned layer can maintain an anti-parallel state (high resistance state of a spin valve).

Here, in a resistance-magnetic field curve, a place where a decrease in 3% from the greatest high resistance state occurs is defined as $H_{uaflat}$. In order to enlarge contribution of spin dependence scattering, the thickness of the pinned layer P is preferably made thicker. However, since magnetization pinning by the PtMn becomes weak in this case, therefore, there is a limit in a thickness of the pinned layer P.

In order to obtain $H_{uaflat}$ which satisfies the above two requirements, and having a level at which satisfactory head operation is ensured, the magnetic thickness of a magnetic layer between the antiferromagnetic layer and ruthenium (Ru) is preferably from 4T nm to 12T nm, and more preferably from 6T nm to 10T nm.

The physical thickness at that time will change by Bs of a magnetic layer, however, is preferably in a range or 2 nm-6 nm, and more preferably in a range of 3-5 nm.

Table 3 shows examples of the pinning layer.

The cobalt iron (CoFe) 4 nm/very thin oxide layer 0.5 nm/cobalt iron (CoFe) 1 nm/on the ruthenium (Ru) layer is the pinned layer P, which directly contributes to the MR ratio.

In the case of the conventional magnetoresistance effect element, a pinned layer was formed only of a metal layer of a simple cobalt iron (CoFe) layer, and a nickel iron (NiFe) layer, nickel iron cobalt (NiFeCo layer) and an iron cobalt (FeCo) layer. On the other hand, in this example, a very thin oxide layer is provided between two cobalt iron (CoFe) layers.

Table 4 shows a typical material of a pinned layer P to which the very thin oxide layer TB is inserted. That is, it is possible to use not only cobalt iron (CoFe) but also various kinds of laminated structures which are listed on Table 4. A formation method of a very thin oxide layer TB will be explained in full detail behind, referring to FIG. 24.

Table 5 shows examples of concrete materials of the very thin oxide layer TB. The band modulation effect is acquired by using an oxide, a nitride, a oxinitride, a phosphide, or a fluoride which contains at least one of the elements which are listed on Table 5, as the material of a very thin oxide layer TB. If an oxide with which at least one contains 3d transition metal elements, such as Ti, Cr, V, Mn, Fe, Co, nickel, and Cu, also in it, and an oxide which contains at least one clement among Al, Si, and Mg is used, it is easily compatible in an effect of band modulation, and an effect of low resistance.

Ta, Zr, Hf, Zn, etc. are also desirable material for the very thin oxide layer TB. As for the thickness of the layer TB, since it is not desirable to raise resistance, it is preferably in a range of 0.2 nm-3 nm, and more preferably in a range of 0.2 nm-2 nm, and still more preferably in a range of 0.5 nm-1 nm. When thickness of a very thin oxide layer is comparatively as thick as 2-3 nm, in order not to raise resistance, the inside of a very thin oxide layer does not oxidized, nitrided or oxinitrided completely, and it may be desirable that they are the phosphide or fluoride.

When very thin oxide layers are 2-3 nm, comparatively thick oxide, nitride, or oxinitride layer, it is desirable to have an element which remains into a very thin oxide layer with a metal state combined neither with oxygen nor nitrogen (element in the state where it has not combined with oxygen or nitrogen). In this case, it is because a rise of resistance is not caused even if thickness is thick. In this case, it is desirable that Co remains in the very thin oxide layer with a metal state. When Co remains, the magnetic coupling of the upper and lower sides through a very thin oxide layer inside of a pinned layer or a free layer can be kept good, even if the thickness of a very thin oxide layer is comparatively thick.

It is more desirable for a two or more layers of thin very thin oxide layers to exist rather than a very thin oxide layer of a comparatively thick single layer exists in a magnetic layer. Especially this is because the bulk scattering effect by spin filtering in a magnetic layer which carried out spin dependence can be acquired without raising resistance. When it aims at the bulk scattering effect in the pinned layer or the free layer, it is especially preferred to have a 2-6 layers of very thin oxide layers TB. However, when providing a single very thin oxide layer for spin-dependent interface scattering, even a single layer may exhibit a greatest effect.

As concrete experiment data, the data of the element where a single layer of the very thin oxide layers was inserted into the pin layer is shown below.

When a very thin oxide layer is 0.5 nm in thickness, AR was about 200 mΩμm$^2$. The MR rate of change when the main element which constitutes a very thin oxide layer is changed are as follows.

In the case of Co, it was 5%. In the case of nickel, it was 2.5%. In the case of Fe, it was 15%. In the case of aluminum, it was 10%. In the case of Ti, it was 11%. In the case of Cr, it was 8%. In the case of V, it was 12%. In the case of Zr, it was 13%. In the case of Mo, it was 12%. In the case of Hf, it was 14%. In the case of Ta, it was 14%.

It is more advantageous to insert in a pin layer rather than a free layer, when inserting a very thin oxide layer, as mentioned above. It is for preventing the degradation of the response to the medium magnetic field of a free layer. It becomes still more remarkable when the very thin non-magnetic layer NM is used together.

In a free layer, when the very thin non-magnetic layer NM is used together, at least 1 nm or more of thickness of the magnetic layer of each top and bottom through the very thin oxide layer TM and the very thin non-magnetic layer NM is required, and more desirably 2 nm or more is required.

Moreover, as mentioned above, when inserting a single very thin oxide layer into a pin layer, the increasing rate of MR may depend on the positions to insert. For example, in the first example mentioned above, instead of the pin structure having 4 nm (CoFe)/0.5 nm of very thin oxide layer/1 nm (CoFe), a structure of 2 nm (CoFe)/0.5 nm of very thin oxide layer/2 nm (CoFe) can be used. In this alternative structure, MR ratio may decrease, since the very thin oxide layer becomes more remote from the space layer.

When the main element of a very thin oxide was Hf, specifically, MR rate of change of the structure of the first example was 14%. On the other hand, in the case of 2 nm (CoFe)/0.5 nm of very thin oxide layer/2 nm (CoFe), MR rate of change falls down to 10%.

Figure 18A:
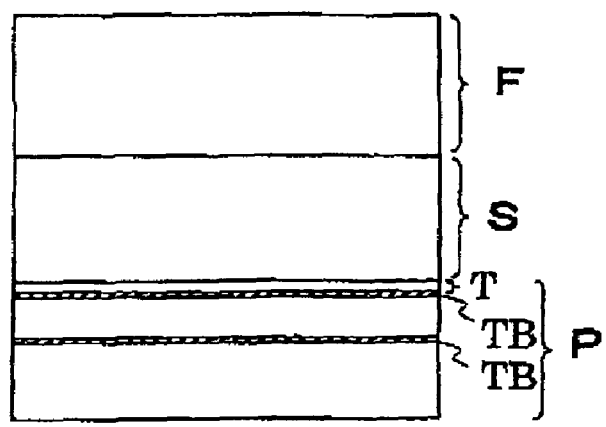
FIGS. 18A through 18D show the structures where the very thin oxide layers TB are provided in both inside the bulk and near the interface in a pinned layer P or a free layer F.
Figure 18B:
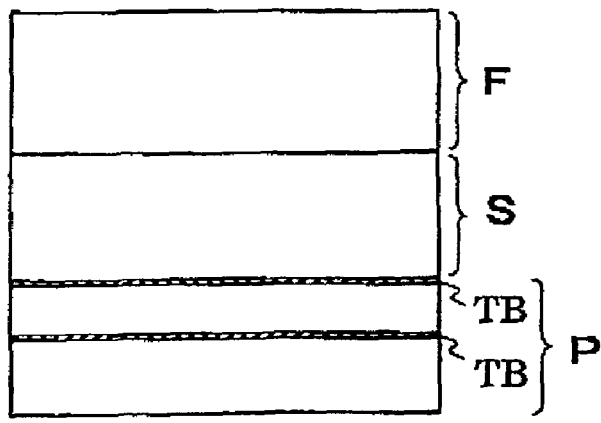
Figure 18C:
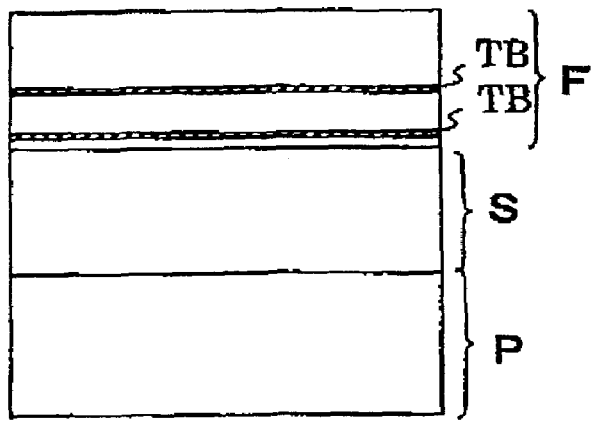
Figure 18D:
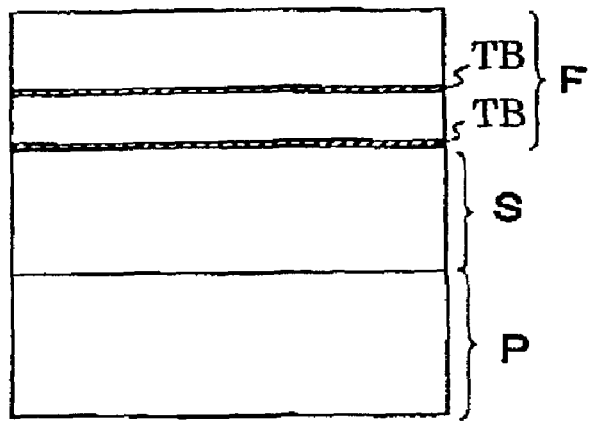
Figure 19A:
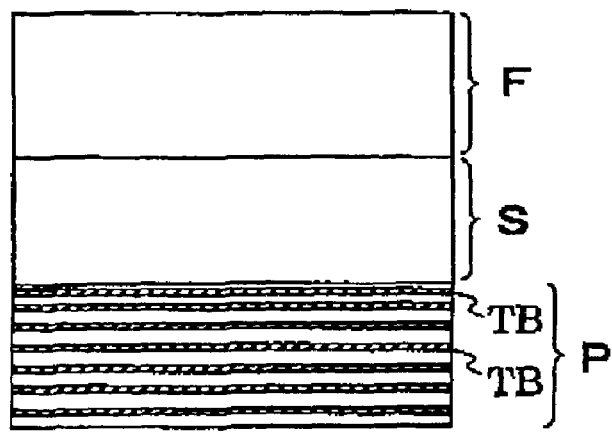
FIGS. 19A through 19D show the structures where two or more very thin oxide layers TB are inserted in either a pinned layer P or a free layer F, in order to aim at interface dependence scattering and the bulk scattering effect, and to reinforce the bulk scattering effect.
Figure 19B:
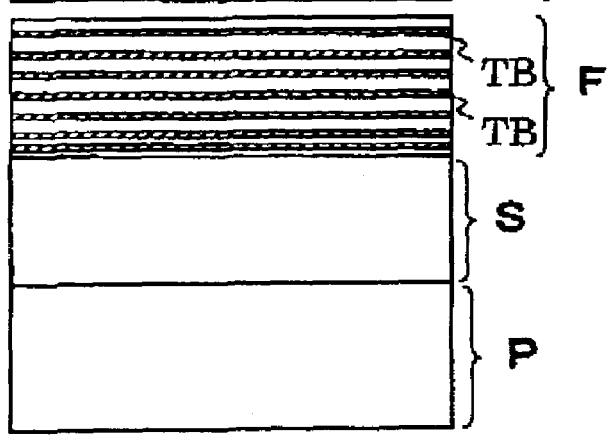
Figure 19C:
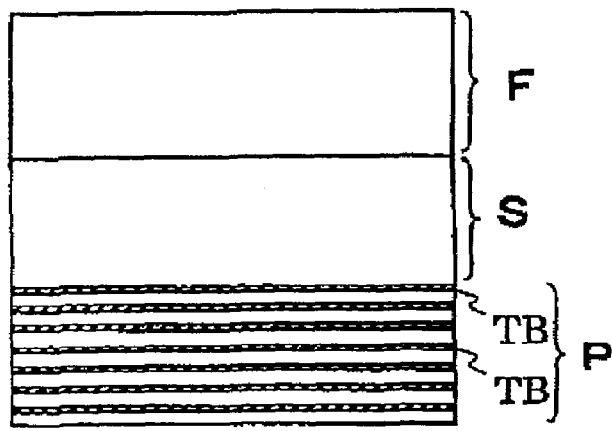
Figure 19D:
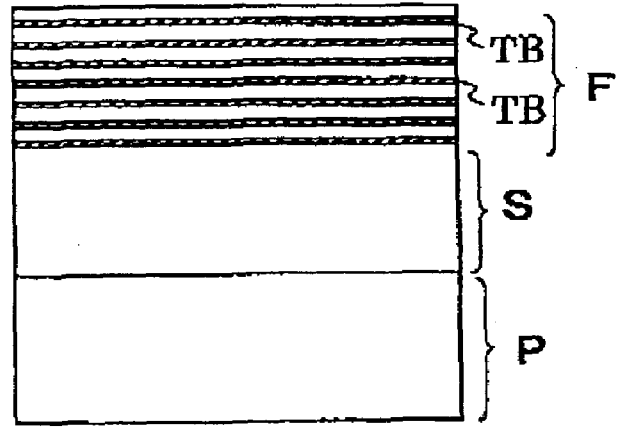

The same phenomenon was observed in the case where Co was used as the main element of the very thin oxide layer. That is, as the very thin oxide layer becomes closer to the space layer, the MR rate becomes larger. That is, the structures as shown in FIG. 16C and FIG. 16D are more desirable than structure as shown in FIG. 18A. As for the insertion point of the very thin oxide layer, specifically, it is desirable to set it as the range of less than 2 nm from a spacer layer. It is more desirable to be within 1 nm from a spacer layer. It is the same even when a very thin oxide layer is inserted in a free layer. That is, it is desirable that a very thin oxide layer exists within 2 nm from a spacer layer, and more desirable that the layer is within 1 nm place from the spacer layer.

When it is insufficient to insert a single very thin oxide layer near the spacer layer, two or more layers very thin oxide layers can be inserted to obtain further improvement. By inserting a very thin oxide layer also in the place separated from the spacer layer rather than 2 nm, MR rate of change goes up further. When inserting two or more very thin oxide layers, the material of each very thin oxide layer can be changed. However, when the main element used as the mother material of a very thin oxide layer is not a non-magnetic element but a magnetic element like Fe and nickel, even if it is inserted in the place separated from the spacer layer rather than 2 nm, the effect of sufficient MR rise may be demonstrated.

In the first example mentioned above, the thickness range from which the thickness of a very thin oxide layer becomes the optimal according to RA. For example, when the main element which constitutes a very thin oxide layer is Hf and thickness is 0.5 nm, RA is 200 m$\Omega\mu m^2$, and MR rate of change is 14%. When the thickness of a very thin oxide layer is 0.2 nm, RA is 150 m$\Omega\mu m^2$ and MR rate of change is 10%. When the thickness of a very thin oxide layer is 1 nm, RA is 250 m$\Omega\mu m^2$, and MR rate of change is 14%. When the thickness of a very thin oxide layer is 2 nm, RA is 300 m$\Omega\mu m^2$ and MR rate of change is 14%. When the thickness of a very thin oxide layer is 3 nm, RA is 500 m$\Omega\mu m^2$ and MR rates of change was 10%.

If the very thin oxide layer becomes thicker, RA becomes larger. On the other hand, if the thickness of a very thin oxide layer becomes thick, MR becomes also larger. However, if a very thin oxide layer becomes thick too much, MR rate of change may fall.

The existence of such a very thin oxide layer can be observed by a section TEM (Transmission Electron Microscopy). When very thin oxide layers are an oxide layer, a nitride layer, and an acid nitride layer, thickness can be discriminated from contrast of a section TEM. When discernment of thickness is difficult, it is also possible to determine the thickness by EDX (Energy Dispersive X-ray spectroscopy) analysis which extracted a diameter of a beam to about 1 nm. In this case, it is also possible to calculate from a half width of the concentration distribution, of oxygen nitrogen, phosphorous, or fluorine while setting the measurement points at intervals of 0.5 nm-1 nm in the film growth direction, and plotting element distribution to a measurement positions.

When a very thin oxide layer consists of oxide or oxinitride, it is most preferred that the high Tc material located upper and lower side is Co or contains Co or Co. As a second choice, nickel or its alloy are preferable, then as a third choice, iron or its alloy are preferable. This is because Co is most hard to oxidize and Ni is harder to oxidize than iron. By preventing oxidization, the steep nature of an interface with a very thin oxide layer can be held, and diffusion of oxygen can be prevented. A structure element of a magnetic material which exists in the upper and lower sides of a very thin oxide layer is discriminable with the nano-EDX scan of a sectional TEM sample etc.

When a very thin oxide layer consists of an oxide layer or an acid nitride layer, as for a very thin oxide layer, it is desirable to include material which combines with oxygen stably, and especially at least one element among Al, Si, Mg, Ti, V, Cr, Mn, Fe, Ta, Zr, Hf, and W is preferred.

In order to form a stable oxide layer or a stable nitride layer, high energy oxidization or a high energy nitride process which are mentioned later are preferred. In that case, when Ar ion beam is used, Ar is contained in the very thin oxide layer in a relatively higher concentration. This content Ar may add a secondary effect to an effect of a very thin oxide layer. In order to acquire such secondary effect, it is desirable for a very thin oxide layer TB to contain Ar more than twice, more desirably three times, compared with the magnetic layers of its upper and lower sides.

A copper (Cu) layer on the pinned layer P is a non-magnetic spacer layer S which divides the pinned layer P and the free layer F magnetically. Instead of copper (Cu), gold (Au), silver (Ag), a ruthenium (Ru), rhodium (Rh), palladium (Pd), etc. can also be used. It is needed that thickness of a spacer layer S is shorter than spin diffusion length in a pinned layer P and a free layer F mentioned later. For example, spin diffusion length of nickel iron (NiFe) is about 5 nm. From the viewpoint, as for the thickness of the spacer layer S, thinner is better.

If resistance in case a conduction electron passes a spacer layer S is high, a problem that MR rate of change falls will arise. Also from this viewpoint, the thinner is better as for the thickness of the spacer layer S.

On the other hand, also when the magnetization direction of a free layer F changes with medium magnetic fields, magnetic coupling between a pinned layer P and a free layer F must be divided so that change may not arise in the magnetization direction of a pinned layer P.

Thus, considering a viewpoint of dividing magnetic coupling between the pinned layer P and the free layer F, the spacer layer S needs to have a certain thickness.

In the case of a spacer layer S formed only with metal, about 1.5 nm of the thickness is the minimum of the thickness. Therefore, as thickness of a spacer layer S, 1.5 nm-5 nm is desirable, and 2 nm-4 nm is still more desirable.

However, in order to constrict the current path in a spacer layer S in the case of CCP-CPP (Current Confined Path Current Perpendicular to Plane) type structure which is mentioned in the next example, an oxide is included in a spacer layer S. In the case of such CCP-CPP type structure, magnetic coupling between a pinned layer P and a free layer F tends to be weak by existence of an oxide layer which produces the CCP effect. Therefore, it becomes possible to make the thickness of the copper (Cu) layers which exist in the upper and lower sides of the CCP spacer thinner than 1.5 nm. For example, it becomes possible to make then thickness of the copper (Cu) spacer layers in the upper and lower sides of an oxide layer for CCP down to 0.1 nm.

As an oxide layer which produces the CCP effect, a tantalum (Ta) oxide, a chromium (Cr) oxide, a titanium (Ti) oxide, a zirconium (Zr) oxide, a hafnium (Hf) oxide, an aluminum (Al) oxide, a silicon (Si) oxide, a magnesium (Mg) oxide, a vanadium (V) oxide, a tungsten (W) oxide, a molybdenum (Mo) oxide, etc. can be mentioned. Thickness of the oxide layer at this time is preferably about 1 nm-3 nm.

Table 6 shows examples of the spacer layer S.

The invention makes it a main purpose to pull out the CPP effect. However, in the case of the TMR (Tunneling Magnetoresistance) effect, the conduction half metal effect of the invention is also effective. The non-magnetic spacer layer in TMR, such $Al_2O_3$, MgO, $SiO_2$, $HfO_2$, and $SrTiO_3$, can be used as a very thin oxide layer TB of the invention. In this case, 1 nm-3 nm is desirable as the thickness of the oxide layer. Since there are restrictions that resistance must not be increased as already stated in applying to a magnetic head, the desirable thickness may be 1 nm-2 nm.

The cobalt iron (CoFe) 1 nm/nickel iron (NiFe) 4 nm on the spacer layer S are free layers F. It is the layer at which the magnetization direction changes with medium magnetic fields. The cobalt iron (CoFe) 1 nm/nickel iron (NiFe) 4 nm are the standard free layers currently used from a generation of CIP (Current-In-Plane) type.

In this case, the cobalt iron (CoFe) layer of 1 nm-thick at the interface with the spacer layer S is an interface layer for suppressing a mixing of the spacer layer S and the nickel iron (NiFe) layer. The nickel iron (NiFe) layer is a soft magnetic layer.

However, it may differ from a CIP type and, in a CPP type case, a layer of 1 nm (CoFe) of cobalt iron between a spacer layer S and a free layer F may not necessarily be needed. The spin dependent interface scattering effect between the spacer layer S and the free layer F in the state where current concentrated on the spacer layer S is produced in a case of CIP type element. On the other hand, the spin dependent interface dependence scattering effect is produced when current passes through between interfaces of the spacer layer S and the free layer F compulsorily in the case of CPP type element. A mixing layer of a nickel iron (NiFe) layer and a copper (Cu) layer may not reduce the spin dependent interface dependence scattering effect. That is, the mixing effect would not be the same for CIP type and for CPP type structure.

As composition of nickel iron (NiFe), nickel70Fe30-nickel90Fe10 is preferred, and the range of nickel78Fe22-nickel83Fe17 is still more preferred. As film structure which raises the spin dependent bulk scattering effect in inside of the free layer F. a nickel iron cobalt (NiFeCo) film, cobalt iron (CoFe)/nickel iron cobalt (NiFeCo) laminated constitution, (NiFeCo/Cu0.1 nm)×n laminated structure, etc. can be mentioned.

As the composition of the nickel iron cobalt (NiFeCo) layer, the composition around nickel66Fe16Co18 is preferable, because at that composition, fcc structure appears and magnetic distortion tends to become zero. As for thickness of copper (Cu) when laminating copper (Cu) on nickel iron cobalt (NiFeCo), it is preferred to set it down to a very thin level, to about 0.1 nm-1 nm. By inserting such a very thin copper (Cu) layer, the spin dependent bulk scattering effect in the inside of the free layer F increases, and MR rate of change increases. Since magnetic coupling of a magnetic layer of the upper and lower sides through the copper layer will go out if copper (Cu) thickness becomes thicker than 1 nm too much, and it stops functioning as the united free layer F, it is not desirable.

Since a cycle of inserting copper (Cu) layers to the free layer F also brings a difference to MR rate of change, it is important. As a thickness interval to insert the copper (Cu) layers repeatedly, 0.5 nm-3 nm is preferred, and 0.7 nm-2 nm is more preferred.

Not only a case of nickel iron cobalt (NiFeCo) but also in the case of nickel iron (NiFe), insertion of such a very thin copper (Cu) layer brings about MR rate of change. Therefore, (NiFe/Cu)×n laminated structure may be adopted. A single layer of CoFe can also be used as a free layer. A laminated structure of (CoFe/Cu)×n can also be used. As the inserting layer for such a laminated structure, a layer made of copper (Cu), zirconium (Zr), hafnium (Hf, niobium (Nb), or material like gallium (Ga) is usable. The thickness of these inserting layers may preferably in a range 0.1 nm-1 nm. By inserting such a layer into the free layer, spin-dependent bulk scattering effect in the free layer may be enhanced, and thus, MR may be improved.

In this example, a magnetic layer is not mixed as an addition element, but very thin layers are inserted at intervals of a certain fixed thickness. In such a case, it is desirable to insert element material which does not form a solid solution with the element which constitutes the magnetic layer. For example, when a zirconium (Zr), a hafnium (Hf), etc. are used, MR rate of change improves and it is especially desirable.

Such existence of a very thin metal layer can be observed by a section TEM (Transmission Electron Microscopy) from a film section etc. even after the heat treatment for magnetization pinning of an antiferromagnetic layer in a magnetic field. When it contained as an addition element simply in a magnetic layer, big concentration distribution is not seen in the direction of a film section. On the other hand, when it inserts as an independent layer like this example, it can observe by a section TEM. By using a nano-EDX (energy dispersive x-ray spectroscopy) of about 1 nm of diameters of beam spot (it is more desirable as smaller than this diameter of spot) is observable as concentration distribution of a structure element by measuring at intervals of 1 nm or less in the direction of thickness.

However, as mentioned above, the inserted thickness may be about 0.1 nm. When EDX analysis of such a very thin layer is carried out with about 1 nm of diameters of beam spot, as a result of EDX analysis, it will be detected as concentration of number atom % also in an area in which a very thin layer exists. However, it is possible by scanning the same measurement in the direction of thickness to identify in an area where a very thin layer element layer exists, and an area which is not carried out.

Table 7 shows the examples of other free layer F.

In this example, a copper (Cu) layer laminated on a free layer F functions also as a prevention layer of interface mixing with tantalum on it (Ta). Instead of copper (Cu), gold (Au), silver (Ag), a ruthenium (Ru), rhodium (Rh), palladium (Pd), etc. may be used. This layer can also be lost, when interface mixing with a cap layer is prevented. As for the thickness of this layer, it is preferred that it is 0 nm-about 3 nm.

A copper (Cu) layer on a free layer F and a tantalum (Ta) layer laminated on it are called a "cap layer" here. This is for protecting so that a lamination film may not be etched, also when the micro fabrication process after spin valve film formation is performed. Instead of a tantalum (Ta) layer, titanium (fi), zirconium (Zr), ruthenium (Ru), niobium (Nb), tungsten (W), hafnium (Hf), rhenium (Re), iridium (Ir), gold (Au), silver (Ag), etc. can be used as a protection layer.

Table 8 shows the examples of the cap layer.

On the other hand, since controlling the crystal orientation of a spin valve film also affects MR rate of change as mentioned above, it is important. By controlling crystal orientation, crystal defects within a spin dependence scattering unit of pinned layer P/spacer layer S/free layer F may be decreased. As the result, spin information on an up spin and a down spin is not lost, and spin diffusion length in a laminated structure can be lengthened enough. That is, even if total thickness of pinned layer P/spacer layer S/free latter F becomes thick, the spin dependence bulk scattering effect can fully be obtained, and MR rate of change improves.

The coherency of the laminated structure also improves by controlling crystal orientation. Therefore, the spin dependent interface scattering effect improves and MR rate of change improves.

Good crystal band structure is formed by controlling crystal orientation. Therefore, a band structural change by insertion of very thin metal layers, such as a copper (Cu) layer of a very thin and a zirconium (Zr) layer of a very thin, which was mentioned above becomes easy to appear notably. As the result, improvement in MR rate of change resulting from band structure becomes more remarkable. For example, when band structure changes, a difference of the Fermi speed of an up spin and a down spin becomes large. This phenomenon becomes more remarkable in a spin valve film with good crystal orientation.

The invention is an aiming at band structure modulation of a crystal. Therefore, when crystal orientation changes, naturally an effect of a very thin oxide layer will change. When a pinned layer P or a free layer F has fcc structure, it is desirable to have fcc (111) orientation. When a pinned layer P or a free layer F has bcc structure, it is desirable to have bcc (110) orientation. When the pinned layer P or the free layer F has hcp structure, it is desirable to have for hcp (001) orientation or hcp (110) orientation.

As for the orientation variation angle, it is preferred that it is less than 5.0 degrees, and it is still preferred that it is less than 3.5 degrees and it is still more preferred that it is less than 3.0 degrees, and that it is most preferred that it is less than 4.0 more degrees. A film having an excellent crystal orientation can obtain high MR rate of change. That is, high output voltage can be obtained.

This reason is explained below. The very thin oxide layer in the invention aims at modulating the band structure of a magnetic layer. Band structure can be defined about what naturally has a crystal structure. That is, more perfect crystal structure is acquired, the effect of the band modulation of a the invention shows up more notably, and the rise effect of MR rate of change becomes larger. The quality of a crystal corresponds to a distribution angle of the crystal orientation. Therefore, the band modulation effect by the invention becomes large and MR rate becomes large, as the distribution angle becomes small.

Concretely, when the distribution angle 6 degrees, the increasing rate of MR rate of change by having inserted the very thin oxide layer by the invention was as small as about 1.1 times. On the other hand, when the distribution angle was 5 degrees, the increasing rate of MR was twice. Moreover, when the distribution angle was 4 degrees, the increasing rate of MR was three times. When the distribution angle was 3.5 degrees, the increasing rate of MR was 4 times. When the distribution angle was 3 degrees, the increasing rate of MR was 5 times. These data were obtained with samples where only one very thin oxide layer was inserted. Therefore, by inserting two or more very thin oxide layers, further improvement can be attained.

In measurement by X-rays, crystal orientation can be measured as half width of a rocking curve in a peak position obtained by θ-2θ measurement. In a magnetic head, it is detectable as a distribution angle of a spot in a nano-diffraction pattern taken from section structure. As for the crystal orientation of the polycrystalline films, the definition of the terms and its measurement procedures, those described in U.S. Pat. No. 6,395,388 can be referred to. The entire contents of this reference is incorporated herein by reference.

Although it is dependent also on material of an antiferromagnetic film, generally the lattice spacing of the antiferromagnetic film differs from lattice spacing of pinned layer P/spacer layer S/free layer F. Therefore, it is possible to calculate separately a variation angle for orientation in each layer.

For example, platinum manganese (PtMn), and pinned layer P/spacer layer S/free layer F become the structure that lattice spacing differ, in many cases. Since platinum manganese (PtMn) is formed comparatively thickly, it is the material suitable for measuring the crystal orientation variation. As for pinned layer P/spacer layer S/free layer F, crystal structures of a pinned layer P and a free layer F may differ like bcc structure and fcc structure. Therefore, the pinned layer P and the free layer F have a distribution angle s for respectively different crystal orientations.

Next, an example about a formation method of a very thin oxide layer TB in the embodiment will be explained.

Figure 24:
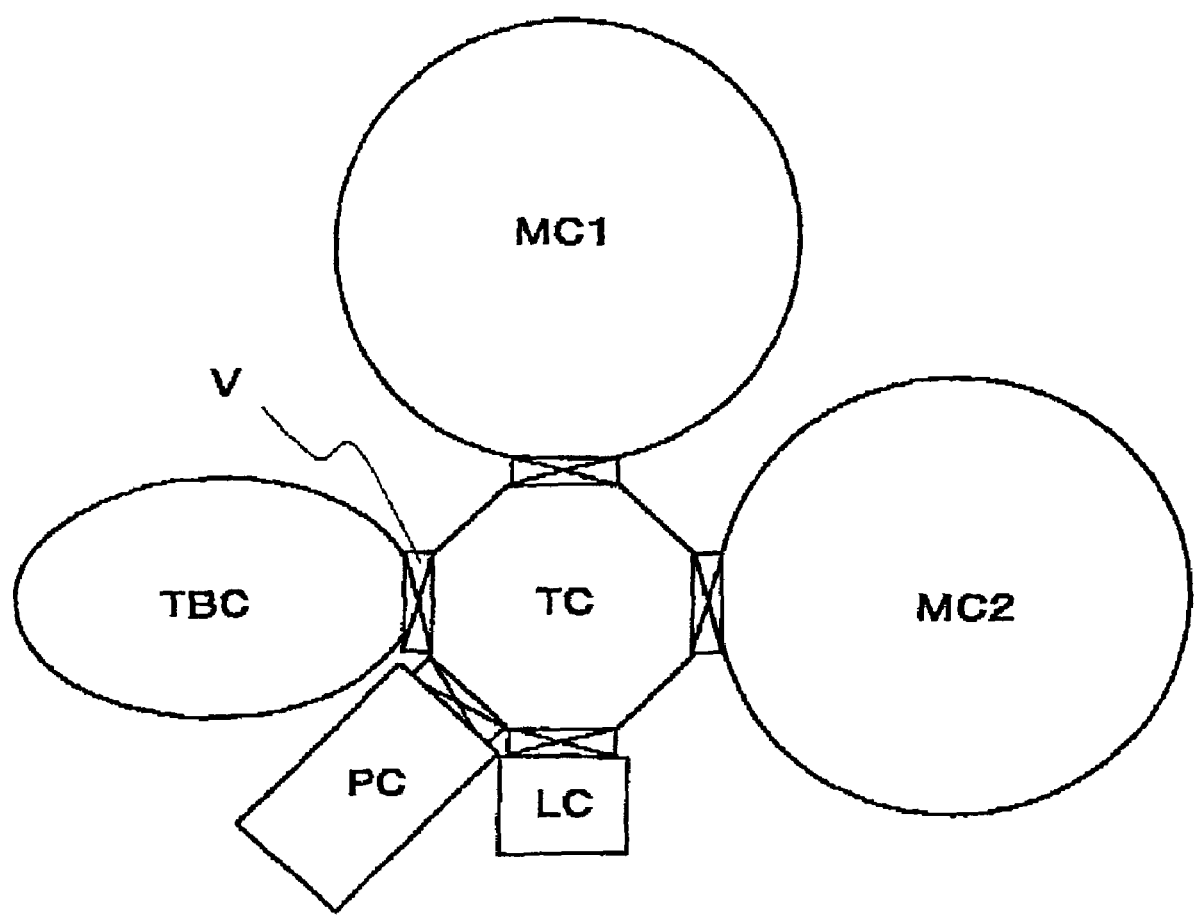
FIG. 24 is a conceptual diagram showing an example of a formation apparatus which forms a magnetoresistance effect element containing a very thin oxide layer TB in the embodiment.

FIG. 24 is a conceptual diagram showing an example of a formation apparatus which forms a magnetoresistance effect element containing a very thin oxide layer TB in the embodiment. That is, in the case of a apparatus of this figure, it has structure where a load lock chamber LC which introduces a substrate, film formation chambers MC1, MC2, and TBC, a surface treatment chamber PC, etc. are connected via a vacuum valve v, via a transfer chamber TC.

In metal film formation chambers MC1 and MC2, film formation of a metal film used as a basic unit of a spin valve film is formed with methods for film deposition, such as a sputtering. Specifically, sputtering film formation of various kinds of methods of DC magnetron film formation, RF magnetron sputtering, and others and IBD (Ion Beam Deposition) may be used. Vapor deposition film formation, MBE (Molecular Beam Epitaxy), etc. may also be used. A very thin oxide layer TB in the embodiment, such as an oxide layer and a nitride layer, may be formed by these film formation chambers.

It is also the desirable manufacture method of a very thin oxide layer, to perform formation of an oxide layer used as a very thin oxide layer TB of the embodiment or a nitride layer in a surface treatment chamber PC on the other hand. Specifically, natural oxidation, the natural nitriding method, UV (ultraviolet rays) light irradiation in the radical oxidizing (nitride) method and oxygen atmosphere, the ozone oxidizing method, the ion beam oxidizing method, etc. can be used.

The oxidization technique with the energy assistant effect is more desirable than a natural oxidation method. For example, since the ion beam oxidizing method etc. has the energy assistant effect by an ion beam, it is effective. Then, oxygen gas may be irradiated as an ion beam and an ion beam of rare gas, such as argon (Ar), xenon (Xe), and krypton (Kr), may be irradiated in oxygen atmosphere.

Since thickness of an oxide layer or a nitride layer will become thick if energy of a beam is too high at this time, the degree of beam incidence angle also has low angle incidence more preferred than perpendicular incidence with energy of a grade which is not too high.

For example, in the case of 90-degree incidence, 50V-150V have the desirable degree of incidence angle as accelerating voltage of an ion beam to the main side of a substrate, and when the degree of incidence angle is the low angle incidence which is 10-30 degrees, about 50-300V is desirable as accelerating voltage of an ion beam.

However, in oxidization and a nitride using the conventional ion beam, energy spreads in the direction as the degree of beam incidence angle where energy of a beam is the same.

Therefore, even if the accelerating voltage of a beam is lowered or the degree of incidence angle is made into low angle incidence, it arises that thickness of an oxide film becomes thick depending on material of the surface which oxidizes. As a method of controlling this further, a method of using GC-IB (Gas Cluster Ion-Beam) which is the ion beam of a cluster state instead of an ion beam of the conventional monomer can be mentioned.

In the case of this method, when it is accelerated in the state of a cluster and an ion beam collides with the sample surface, a cluster bursts with quantity of motion in the direction of the film surface. Thus, a high-concentration gas molecule has the energy to the direction of a film plane (getting it blocked and there being no damage to the direction of thickness), and collides. If an oxygen cluster is used as a gas molecule, it is compatible in oxide formation by high energy oxidization and formation in a very thin level. By adjusting the number of gas clusters, oxygen concentration per unit surface area can be adjusted. Therefore, the valence number can be also controlled.

SECOND EXAMPLE

Next, the example of the CPP type magnetoresistance effect element which can be used as a magnetic head is given and explained as the second ample of the invention.

Figure 25:
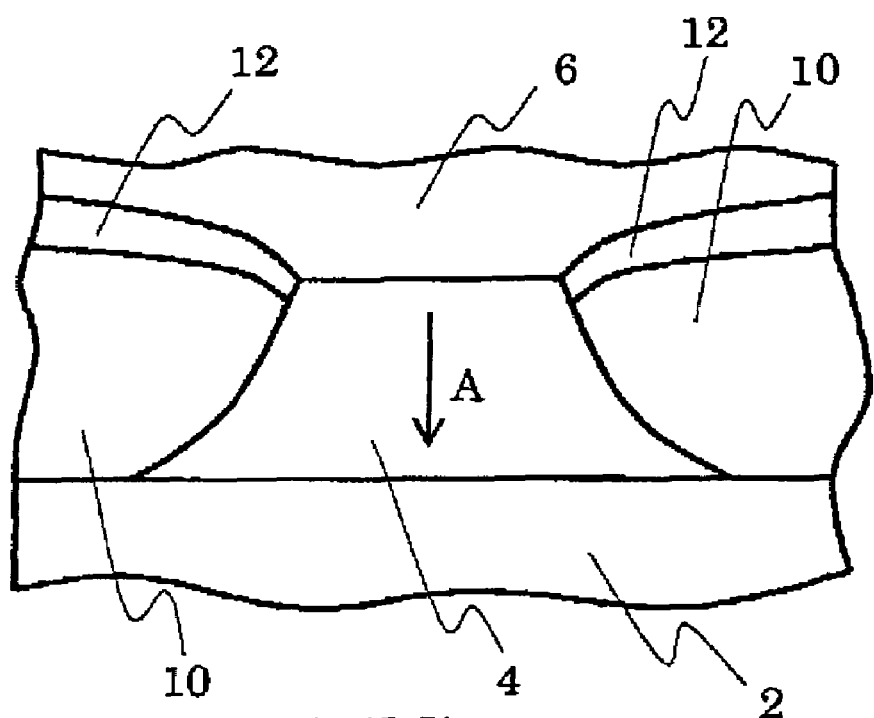
FIG. 25 is a sectional view of the magnetoresistance effect element cut in parallel to the medium facing surface P which is opposite to a magnetic recording medium (not shown)
Figure 26:
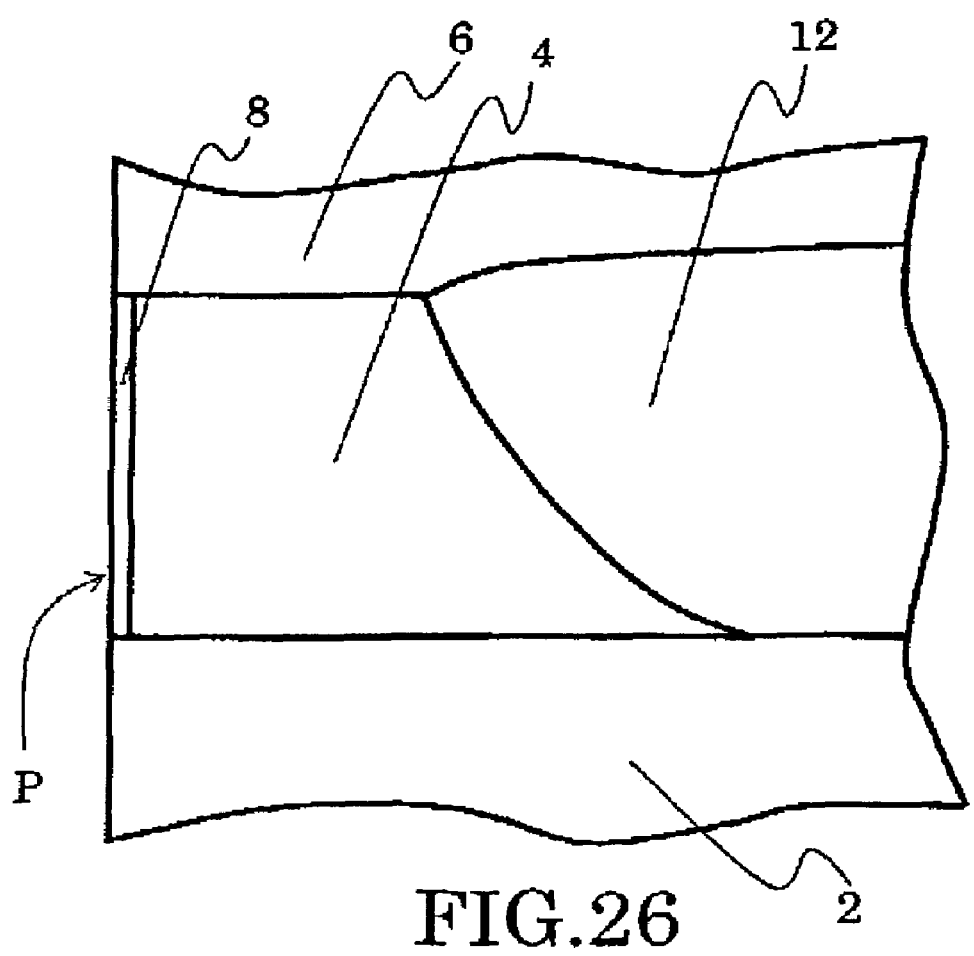
FIG. 26 is a sectional view of the magnetic resistance effect element cut in the perpendicular direction to the medium opposite side P.

FIGS. 25 and 26 are conceptual diagrams which express typically the principal part structure of the magnetoresistance effect element concerning the embodiment of the invention. That is, these figures express the state where the magnetoresistance effect element is included in the magnetic head. FIG. 25 is a sectional view of the magnetoresistance effect element cut in parallel to the medium facing surface P which is opposite to a magnetic recording medium (not shown). FIG. 26 is a sectional view of the magnetic resistance effect element cut in the perpendicular direction to the medium opposite side P.

The magnetoresistance effect element illustrated in FIGS. 25 and 26 has a hard abutted structure. The lower electrode 2 and the upper electrode 6 are provided in the upper and lower sides of the magnetoresistance effect film 4, respectively. Moreover, as expressed in FIG. 25, the bias magnetic field applying film 10 and the insulating film 12 are laminated and provided in the both sides of the magnetoresistance effect film 4. Furthermore, as illustrated in FIG. 26, the protection layer 8 is provided in the medium facing surface of the magnetoresistance effect film 4.

The magnetoresistance effect film 4 has the structure according to the embodiment of the invention mentioned above referring to FIGS. 1 and 24. That is, the very thin oxide layer is suitably inserted in the magnetoresistance effect film, and a large resistance change can be obtained by CPP type current supply.

The sense current to the magnetoresistance effect film 4 is passed in a perpendicular direction to the film plane, as indicated by the arrow A, with the electrodes 2 and 6 arranged at the upper and lower sides. Moreover, a bias magnetic field is applied to the magnetoresistance effect film 4 with a pair of bias magnetic field applying films 10 and 10 provided in right and left.

By this bias magnetic field, magnetic anisotropy of the free layer of the magnetoresistance effect film 4 can be controlled and formed into a single magnetic domain. As a result, magnetic domain structure can be stabilized, and the Barkhausen noise due to the movement of magnetic wall can be suppressed.

According to the invention, MR rate of change improves by providing the very thin oxide layer suitably in the magnetoresistance effect film 4. As a result, it becomes possible to improve the sensitivity of a magnetoresistance effect element notably. And for example, when it is applied to a magnetic head, magnetic reproduction of high sensitivity is attained.

THIRD EXAMPLE

Next, a magnetic reproducing apparatus having inboard the magnetoresistance effect element of the embodiment will be explained as the third example of the invention.

That is, the magnetoresistance effect element or the magnetic head explained with reference to FIGS. 1 through 26 can be incorporated in a recording/reproducing magnetic head assembly and mounted in a magnetic reproducing apparatus.

Figure 27:
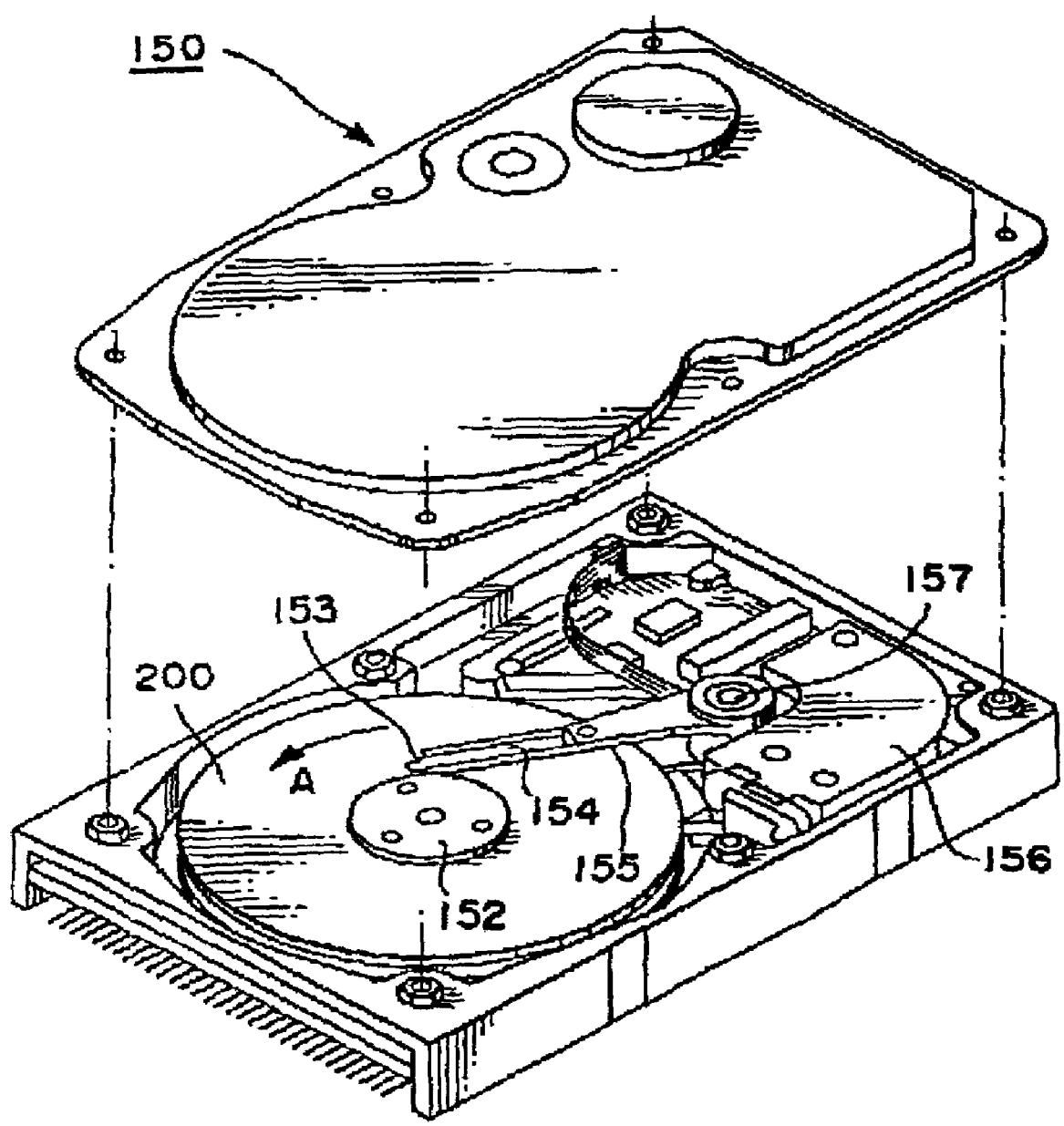
FIG. 27 is a perspective view that shows outline configuration of this kind of magnetic reproducing apparatus.

FIG. 27 is a perspective view that shows outline configuration of this kind of magnetic reproducing apparatus. The magnetic reproducing apparatus 150 shown here is of a type using a rotary actuator. A magnetic reproducing medium disk 200 is mounted on a spindle 152 and rotated in the arrow A direction by a motor, not shown, which is responsive to a control signal from a controller of a driving mechanism, not shown. The magnetic reproducing apparatus 150 shown here may have a plurality of medium disks 200 inboard.

The medium disk 200 may be of a "lateral recording type" in which directions of the recording bits are substantially in parallel to the disk surface or may be of a "perpendicular recording type" in which directions of the recording bits are substantially perpendicular to the disk surface.

A head slider 153 for carrying out recording and reproduction of information to be stored in the medium disk 200 is attached to the tip of a film-shaped suspension 154. The head slider 153 supports a magnetoresistance effect element or magnetic head, for example, according to one of the foregoing embodiments of the invention, near the distal end thereof.

Once the medium disk 200 rotates, the medium-facing surface (ABS) of the head slider 153 is held floating by a predetermined distance above the surface of the medium disk 200. Also acceptable is a so-called "contact-traveling type" in which the slider contacts the medium disk 200.

The suspension 154 is connected to one end of an actuator arm 155 having a bobbin portion for holding a drive coil, not shown, and others. At the opposite end of the actuator arm 155, a voice coil motor 156, a kind of linear motor, is provided. The voice coil motor 156 comprises a drive coil, not shown, wound on the bobbin portion of the actuator arm 155, and a magnetic circuit made up of a permanent magnet and an opposed yoke that are opposed to sandwich the drive coil.

The actuator an 155 is supported by ball bergs, not shown, which are located at upper and lower two positions of the spindle 157 and driven by the voice coil motor 156 for rotating, sliding movements.

Figure 28:
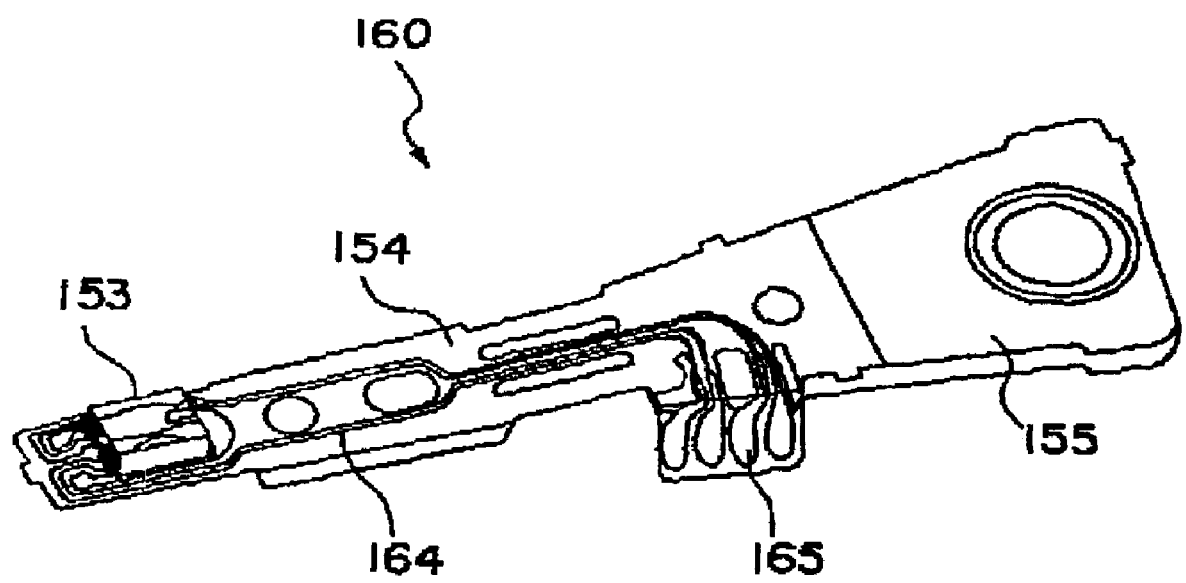
FIG. 28 is a perspective view of a magnetic head assembly at the distal end from an actuator arm 155 involved, which is viewed from the disk.

FIG. 28 is a perspective view of a magnetic head assembly at the distal end from an actuator arm 155 involved, which is viewed from the disk. The magnetic head assembly 160 includes the actuator arm 155 having the bobbin portion supporting the drive coil, for example, and the suspension 154 is connected to one end of the actuator arm 155.

At the distal end of the suspension 154, a head slider 153 carrying the magnetoresistance effect element as explained with reference to FIGS. 1 through 24 is provided. The suspension 154 has a lead 164 for writing and reading signals, and the lead line 164 is connected to electrodes of the magnetic head incorporated in the head slider 153. Numeral 165 in FIG. 28 denotes an electrode pad of the magnetic head assembly 160.

According to this example, one of the magnetoresistance effect elements already explained in conjunction with the aforementioned embodiments is used as the magnetoresistance effect element, information magnetically recorded on the medium disk 200 under a higher recording density than before can be read reliably.

FOURTH EXAMPLE

Next, a magnetic memory having the magnetoresistance effect element of the embodiment will be explained as the fourth example of the invention. That is, a magnetic memory, such as a magnetic random access memory (MRAM), where memory cells are arranged in the shape of a matrix can be realized by using the magnetoresistance effect element of the embodiment.

Figure 29:
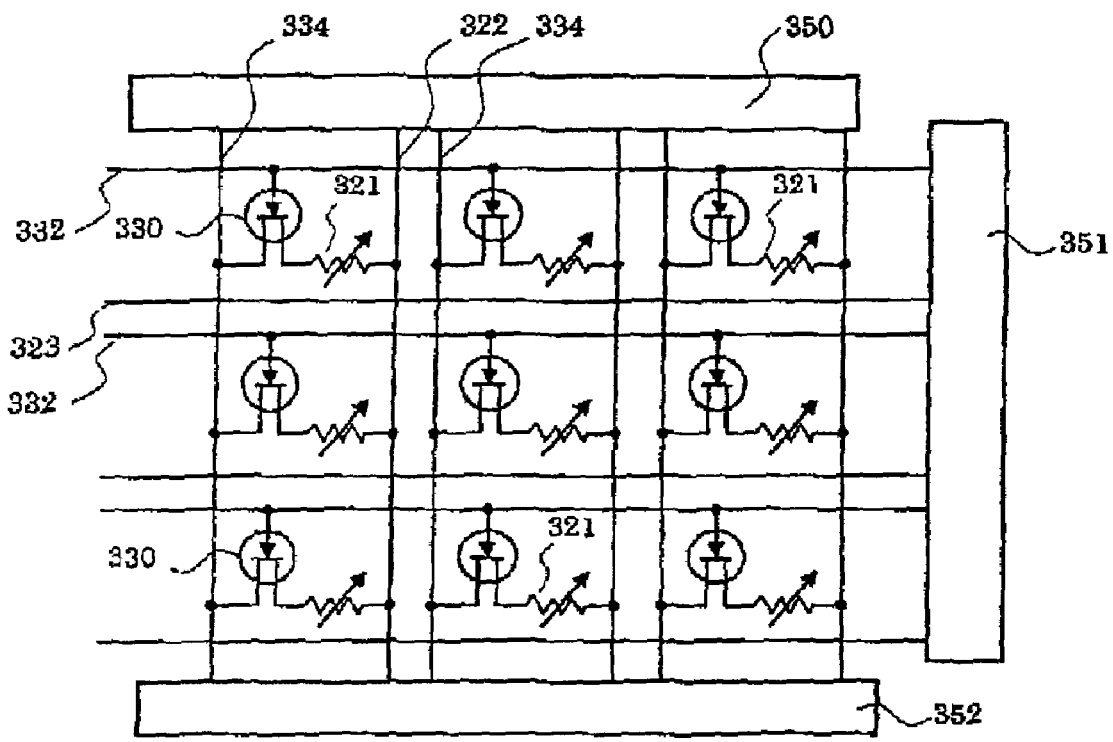
FIG. 29 is a conceptual diagram which exemplifies the matrix structure of the magnetic memory of the embodiment.

FIG. 29 is a conceptual diagram which exemplifies the matrix structure of the magnetic memory of the embodiment. That is, this figure shows the circuit structure of the embodiment in the case of having arranged the memory cells each of which includes a magnetoresistance effect element mentioned above with reference to FIGS. 1 through 24, in the shape of a matrix array.

In order to choose one bit in an array, it has the sequence decoder 350 and the line decoder 351. By selecting the bit line 334 and the word line 332, specific switching transistor 330 is turned on and a specific cell is chosen uniquely. And the bit information recorded on the magnetic-recording layer which constitutes the magnetoresistance effect element 321 can be read by detecting with a sense amplifier 352.

When writing in bit information, writing current is passed in the specific write-in word line 323 and the specific bit line 322, respectively, and the current magnetic field is applied to the recording layer of a specific cell.

Figure 30:
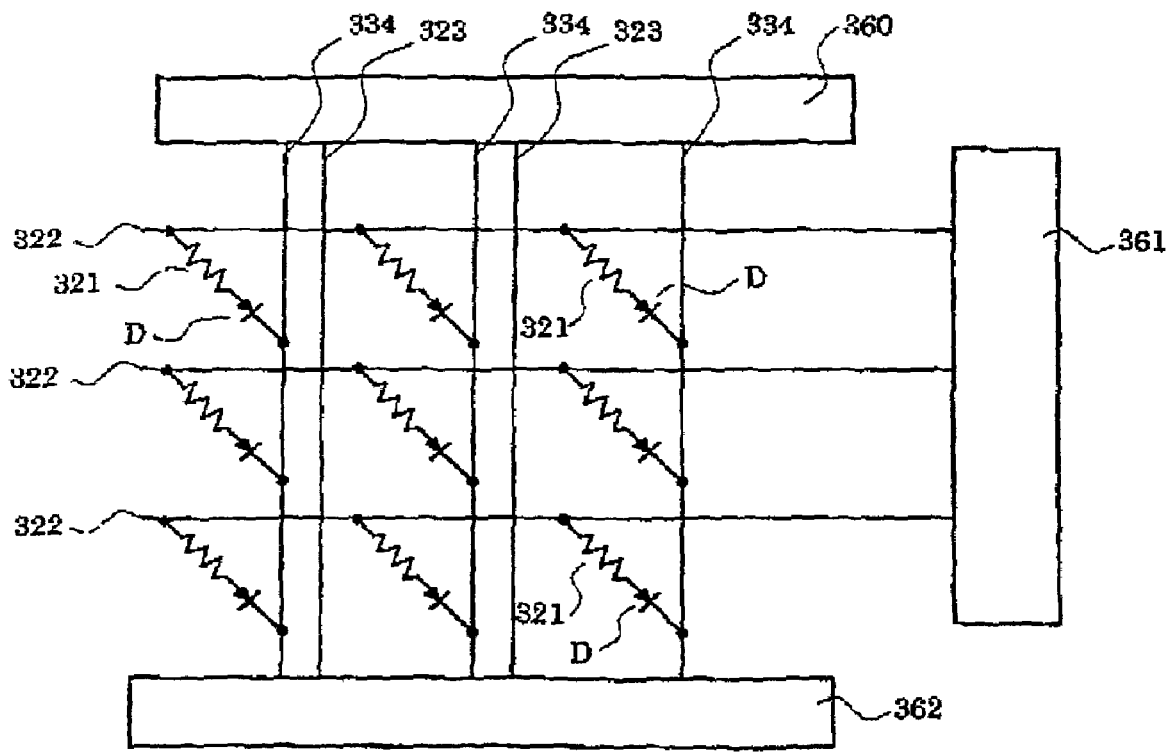
FIG. 30 is a conceptual diagram showing another example of the matrix structure of the magnetic memory of the embodiment.

FIG. 30 is a conceptual diagram showing another example of the matrix structure of the magnetic memory of the embodiment. That is, in the case of this example, the bit lines 322 and word lines 334 which were wired in the shape of a matrix are chosen by decoders 360 and 361, respectively, and the specific memory cell in an array is chosen uniquely.

Each memory cell has the structure where Diode D is connected with the magnetoresistance effect element 321 in series. Here, Diode D has the role to prevent that sense current detours in memory cells other than magnetoresistance effect element 321 selected.

In writing, write-in current is passed in a specific bit line 322 and a word line 323, thereby applying the current magnetic field to the recording layer of a specific cell.

Figure 31:
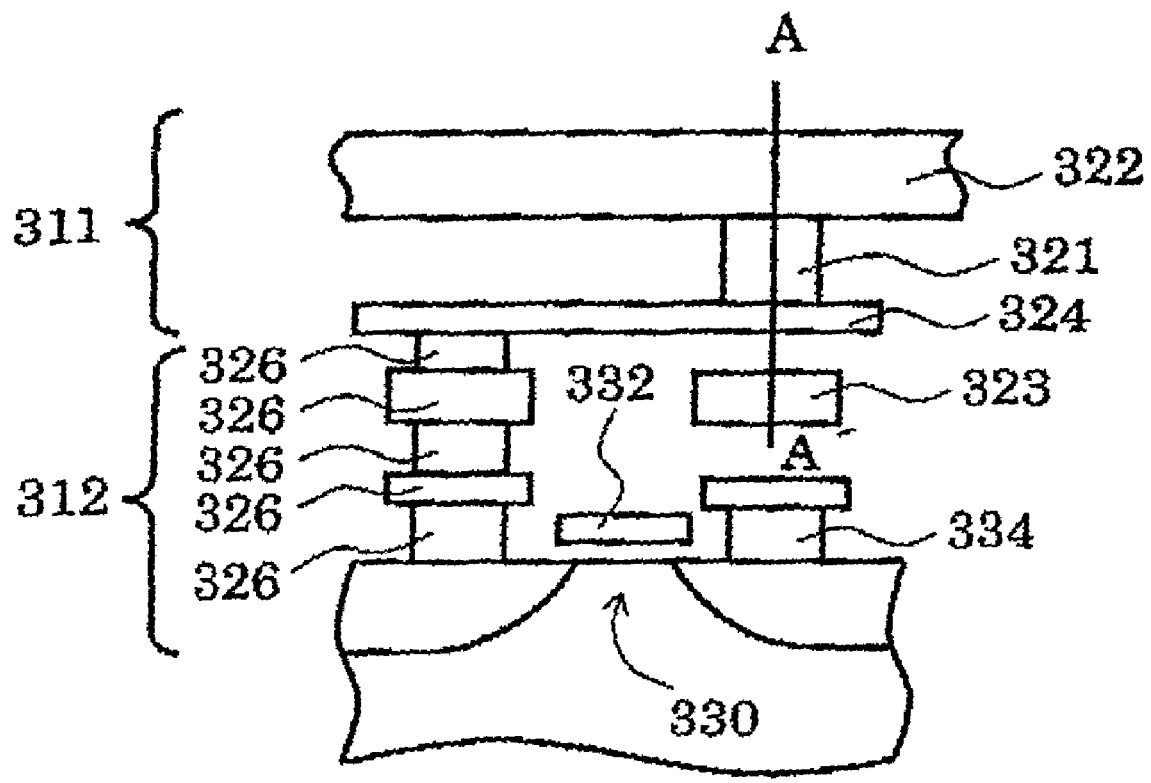
FIG. 31 is a conceptual diagram showing a principal part of the cross sectional structure of a magnetic memory according to an embodiment of the invention.

FIG. 31 is a conceptual diagram showing a principal part of the cross sectional structure of a magnetic memory according to an embodiment of the invention.

Figure 32:
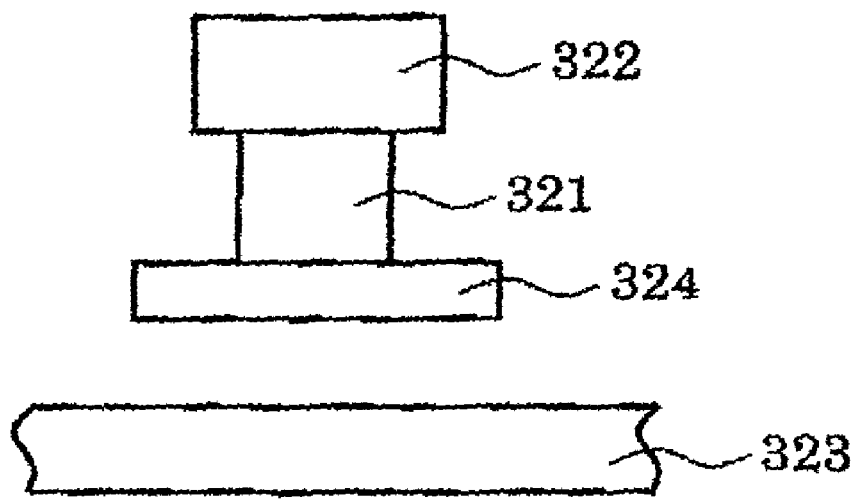
FIG. 32 shows the A-A' line sectional view.

And FIG. 32 shows the A-A' line sectional view.

That is, the structure shown in these figures corresponds to the memory cell of the 1-bit portion of the magnetic memory which operates as a random access memory.

This memory cell consists of a storage cell portion 311 and a transistor portion 312 for address selection. The storage cell portion 311 has the magnetoresistance effect element 321 and a pair of wiring 322 and 324 connected to the element 321. The magnetoresistance effect element 321 has a structure mentioned with reference to FIGS. 1 through 24, and shows a large magnetoresistance effect.

What is necessary is to pass sense current for the magnetoresistance effect element 321 in the case of bit information readout, and just to detect the resistance change. In addition, the magnetization free layer of the magnetoresistance effect element can be used as the magnetic recording layer.

If the element 4 has a ferromagnetic double tunnel junction structure such as magnetic layer/non-magnetic tunnel layer/magnetic layer/non-magnetic tunnel layer/magnetic layer etc., it is advantageous at a point that the high magnetoresistance effect is acquired by a large resistance change by the tunnel magnetoresistance (TMR) effect.

In such structures, one of magnetic layers shall act as a magnetization pinned layer, and one of other magnetic layers shall act as a magnetic record layer.

A selecting transistor 330 connected through a via 326 and buried wiring 328 is formed in a transistor portion 312 for selection, This transistor 330 cares out switching operation according to the voltage applied to a gate 332, and controls switching of the current path between the magnetoresistance effect element 321 and wiring 334.

Moreover, under the magnetoresistance effect element, the write-in wiring 323 is formed in the direction which intersects the wiring 322. These write-in wirings 322 and 323 can be formed with the alloy containing aluminum (aluminum), copper (Cu), tungsten (W), tantalum (Ta), or one of these.

In a memory cell of such structure, when writing bit information in the magnetoresistance effect element 321, a write-in pulse current is passed to the wirings 322 and 323. Then, a synthetic magnetic field induced by these current is applied to a record layer, and magnetization of a record layer of the magnetoresistance effect element can be reversed suitably.

On the other hand, when reading bit information, sense current is passed through wiring 322, the magnetoresistance element 321 containing a magnetic-recording layer, and the lower electrode 324, and a change of the resistance of the magnetoresistance effect element 321 or resistance itself is measured.

By using the magnetoresistance effect element mentioned with reference to FIGS. 1 through 24, a large magnetoresistance effect is obtained. Therefore, a stable read-out can be performed even if the cell size is reduced to realize a large capacity storage.

Heretofore, embodiments of the invention have been explained in detail with reference to some specific examples. The invention, however, is not limited to these specific examples.

For example, material, shape and thickness of the ferromagnetic layer, anti-ferromagnetic layer, insulating film and very thin oxide layer of the magnetoresistance effect element according to the invention may be appropriately selected by those skilled in the art within the known techniques to carry out the invention as taught in the specification and obtain equivalent effects.

Further, in a case where the magnetoresistance effect element of the invention is applied to a magnetic head, by providing magnetic shields on upper and lower side of the element, the reproducing resolution can be regulated.

It will be also appreciated that the invention is applicable not only to optically-assisted magnetic heads or magnetic recording apparatuses of the lengthwise recording type but also to those of the perpendicular magnetic recording type and ensures substantially the same effects.

Further, the magnetic reproducing apparatus according to the present invention may be of a fixed type in which specific magnetic recording medium is permanently installed, while it may be of a removable type in which the magnetic recording medium can be replaced easily.

Further, also concerning the magnetic memory according to the invention, those skilled in the art will be able to carry out the invention by appropriately selecting a material or a structure within the known techniques.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

TABLE 1

EFFECT OF THE LAYER TB

1. SHIFT OF DOS
2. DIFFERENCE IN FERMI SPEEDS $v_f^\uparrow$ and $v_f^\downarrow$

by combining these two effects
spin polarization changes and
half metallic property generated

increase in MR ratio
no increase in CPP resistance

TABLE 2

Ta 1~6 nm/NiFe 2~5 nm
(Ta can be omitted. Zr, Cr, W, Hf, V or Ti can be used instead of Ta.)
Ta 1~6 nm/NiFeCr 2~7 nm (Cr concentration: 5~45 atomic %)
(Ta can be omitted. Zr, Cr, W, Hf, V or Ti can be used instead of Ta.)
Ta 1~6 nm/NiFeCr 2~7 nm/NiFe 0.5~2 nm (Cr concentration: 5~45 atomic %)
(Ta can be omitted. Zr, Cr, W, Hf, V or Ti can be used instead of Ta.)
Ta 1~6 nm/Ru, Cu, Ir, etc.: 2~5 nm
(Ta can be omitted. Zr, Cr, W, Hf, V or Ti can be used instead of Ta.)
Ta 1~6 nm/NiCr 2~5 nm
(Ta can be omitted. Zr, Cr, W, Hf, V or Ti can be used instead of Ta.)
Ta 1~6 nm/NiFe 2~5 nm/current constriction layer 0.5~3 nm/Cu 0~2 nm
(Ta can be omitted. Zr, Cr, W, Hf, V or Ti can be used instead of Ta.)
(current constriction layer: oxide of Al, Cr, Mg, Hf, etc., Au, Ag, Ru, Rh or Re can be used instead of Cu.)
(In order to improve the quality of the free layer, Cu layer may preferably be thicker than 0.1 nm.)
Ta 1~6 nm/NiFeCr 2~5 nm/current constriction layer 0.5~2 nm/Cu 0~2 nm
(Ta can be omitted. Zr, Cr, W, Hf, V or Ti can be used instead of Ta.)
(current constriction layer. oxide of Al, Cr, Mg, Hf, etc. Au, Ag, Ru, Rh or Re can be used instead of Cu.)

TABLE 2-continued (In order to improve the quality of the free layer, Cu layer may preferably be thicker than 0.1 nm.)

TABLE 3 antiferromagnetic layer (PtMn, IrMn, PdPtMn, RuRhMn, etc.) 5~30 nm
antiferromagnetic layer (PtMn, IrMn, PdPtMn, RuRhMn, etc.)
5~30 nm/ferromagnetic layer (CoFe, FeCo, NiFe, etc.) 2~7 nm/Ru 0.9 nm/hard magnetic layer (CoPt, CoCtPt, FePt, Co, etc.) 5~30 nm

TABLE 4

NiFe 2~12 nm (Ni:Fe = 0:100~100:0)
CoFe 2~12 nm (Co:Fe = 0:100~100:0)
FeCo 2~12 nm (Fe:Co = 0:100~100:0)
NiFeX 2~12 nm (Ni:Fe = 0:100~100:0) (X = Al, Si, Ti, V, Cr, Mn, Co, Cu, Zn, Ga, Zr, Nb, Mo, Ru, Rh, Pd, Ag, Hf, Ta, W, Re, Os, Ir, Pt, Au, etc.)
CoFeX 2~12 nm (Co:Fe = 0:100~100:0) (X = Al, Si, Ti, V, Cr, Mn, Co, Cu, Zn, Ga, Zr, Nb, Mo, Ru, Rh, Pd, Ag, Hf, Ta, W, Re, Os, Ir, Pt, Au, etc.)
FeCoX 2~12 nm (Fe:Co = 0:100~100:0) (X = Al, Si, Ti, V, Cr, Mn, Co, Cu, Zn, Ga, Zr, Nb, Mo, Ru, Rh, Pd, Ag, Hf, Ta, W, Re, Os, Ir, Pt, Au, etc.)
NiFeX 2~10 nm/CoFe 0.5~3 nm (Ni:Fe = 75:25~87:13, Co:Fe = 85:15~95:5)
$Ni_xFe_yCo_{100-(x+y)}$ 3~12 nm (x:y = 65:35~90:10, x + y = 99~70)
$Ni_xFe_yCo_{100-(x+y)}$ 3~12 nm/CoFe 0.5~3 nm (x:y = 65:35~90:10, Co:Fe = 85:15~95:5)
$Co_xFe_yNi_{100-(x+y)}$ 3~12 nm (x:y = 70:30~93:7, x + y = 99~80)
$Co_xFe_yB_{100-(x+y)}$ 3~12 nm (x:y = 80:20~93:7, x + y = 99~90)
NiFe 2~10 nm/CoFeNi 0.5~3 nm (Ni:Fe = 75:25~87:13)
NiFe 2~10 nm/FeCo 0.5~3 nm (Ni:Fe = 75:25~87:13)
FeCo 2~7 nm (Fe:Co = 80:20~30:70, preferably Fe:Co = 60:40~40:60, FeCo may preferably have a bcc structure.)
(FeCo 0.8~2 nm/Cu 0.1~1 nm) × N
(N = 2~8, total thickness: 2~7 nm, Fe:Co = 80:20~30:70, preferably Fe:Co = 60:40~40:60, FeCo may preferably have a bcc structure.)
$Fe_xCo_yNi_{100-(x+y)}$ 2~7 nm (x:y = 40:60~70:30, x + y = 50~99, FeCoNi may preferably have a fcc structure.)
(FeCoNi 0.8~2 nm/Cu 0.1~1 nm) × N
(N = 2~8, total thickness: 2~7 nm, x:y = 40:60~70:30, x + y = 50~99, FeCoNi may preferably have a fcc structure.)
(Zr, Hf, Pd or Rh can be used instead of Cu.)
$Fe_xCo_yNi_{100-(x+y)}$ 2~7 nm/CoFe 0.5 nm~3 nm (x:y = 40:60~70:30, x + y = 50~99, FeCoNi may preferably have a fcc structure. FeCo can be used instead of CoFe.)
(FeCoNi 0.8~2 nm/Cu 0.1~1 nm) × N/CoFe 0.5~3 nm
(N = 2~8, total thickness: 2~7 nm, x:y = 40:60~70:30, x + y = 50~99, FeCoNi may preferably have a fcc structure. FeCo can be uesd instead of CoFe.)
(Zr, Hf, Pd or Rh can be used instead of Cu.)

TABLE 5 oxide, nitride, oxinitride, phoshide, or fluoride including at least one of Al, Ti, V, Cr, Mn, Fe, Co, Ni, Cu: 0.2 nm-3 nm (preferably in a range of 0.2 nm-2 nm)
oxide, nitride, oxinitride, phosphide, or fluoride including at least one of Al, Ti, V, Cr, Mn, Fe, Co, Ni, Cu: 0.2 nm-3 nm (preferably in a range of 0.2 nm-2 nm)
(film is not uniform, oxides, nitrides, etc. scatters discontinuously in the film.)
oxide, nitride, oxinitride, phosphide, or fluoride including at least one of Zr, Nb, Mo, Tc, Ru, Rh, Pd, Ag, Hf, Ta, W, Re,, Os: 0.2 nm-3 nm (preferably 0.2 nm-2 nm)
oxide, nitride, oxinitride, phosphide, or fluoride including at least one of Zr, Nb, Mo, Tc, Ru, Rh, Pd, Ag, Hf, Ta, W, Re, Os, Ir, Pt, Au: 0.2 nm-3 nm)
(film is not uniform, oxinitride, et. scatters discontinuously in the film.)

TABLE 6

Cu 1.5~7 nm
Au, Ag, Pd, Ru, Rh, Re, Cr, etc.: 1.5~7 nm
Alloys including at least one of Cu, Au, Ag, Pd,
Ru, Rh, Re, Cr: 1.5~7 nm
Cu 0.1 nm~2 nm/current constriction layer
0.5~3 nm/Cu 0.1 nm~2 nm
(current constriction layer: aluminum oxide, chromium oxide,
etc. Au, Ag, Ru, Rh or Re can be used instead of Cu)
(In order to improve the quality of the free layer and the pinned layer,
Cu may preferably be thicker than 0.1 nm.)

TABLE 7

NiFe 3~12 nm (Ni:Fe = 75:25~87:13)
CoFe 0.5~3 nm/NiFe 2~10 nm (Co:Fe = 85:15~95:5,
Ni:Fe = 75:25~87:13)
$Ni_xFe_yCo_{100-(x+y)}$ 3~12 nm (x:y = 65:35~90:10, x + y = 99~70)
CoFe 0.5~3 nm/$Ni_xFe_yCo_{100(x+y)}$ 3~12 nm (Co:Fe = 85:15~95:5,
x:y = 65:35~90:10)
$Co_xFe_yNi_{100-(x+y)}$ 3~12 nm (x:y = 70:30~93:7, x + y = 99~80)
$Co_xFe_yB_{100-(x+y)}$ 3~12 nm (x:y = 80:20~93:7, x + y = 99~90)
CoFeNi 0.5~3 nm/NiFe 2~10 nm (Ni:Fe = 75:25~87:13)
FeCo 0.5~1 nm/NiFe 2~10 nm (Ni:Fe = 75:25~87:13)
(NiFe 0.8 nm~3 nm/Cu 0.1 nm~2 nm) × N (N = 2~6, total
thickness: 3~12 nm)
Ni:Fe = 75:25~87:13, Zr, Hf, Rh, Ru can be used Instead of Cu)
(CoFe 0.5~3 nm/(NiFe 0.8 nm~3 nm/Cu 0.1 nm~2 nm) × N (N = 2~6,
total thickness: 3~12 nm)
(Ni:Fe = 75:25~87:13, Zr, Hf, Rh, Ru can be used instead of Cu.)

TABLE 8

Ta 1~10 nm (Ti, Cr, W, Hf, Zr, V, Cu, Au, Ag can be used instead of Ta.)
Cu 0.5~5 nm/Ta 1~10 nm (Au, Ag, Ru, Rh, Re, Pt, Ir, Os
can be used instead of Cu.)
(Ti, Cr, W, Hf, Zr, V can be used Instead of Ta.)
Alloys including at least one of Cu, Au, Ag, Pd, Ru, Rh, Re and Cr:
1.5~7 nm
Cu 0 nm~2 nm/current constriction layer 0.5~3 nm/Cu 0 nm~2 nm
(current constriction layer: oxide of Al, Cr, Mg, Hf, etc. Au, Ag, Ru, Rh,
Re can be used instead of Cu.)
(In order to improve the quality of the free layer and pinned layer,
Cu may preferably thicker than 0.1 nm.)

What is claimed is:

1. A magnetoresistance effect element comprising:
a magnetoresistance effect film having:
a first magnetic layer whose direction of magnetization is substantially pinned in one direction;
a second magnetic layer whose direction of magnetization changes in response to an external magnetic field;
a nonmagnetic intermediate layer located between the first and second magnetic layers; and
a film provided in the first magnetic layer, in the second magnetic layer, at an interface between the first magnetic layer and the nonmagnetic intermediate layer, or at an interface between the second magnetic layer and the nonmagnetic intermediate layer, the film having a thickness not larger than 3 nanometers, and the film having at least one selected from the group consisting of nitride, oxynitride, phosphide, and fluoride; and
a pair of electrodes electrically coupled to the magnetoresistance effect film and configured to supply a sense current perpendicularly to a film plane of the magnetoresistance effect film,
wherein at least one of the first and second magnetic layers is made of a material having a crystal structure of a face centered cubic, its film plane is oriented in a direction substantially parallel to (111) plane, its orientation dispersion angle is equal to or smaller than 5 degrees, and the film includes at least one element selected from the group consisting of magnesium (Mg), aluminum (Al), silicon (Si), titanium (Ti), vanadium (V), chromium (Cr), manganese (Mn), iron (Fe), cobalt (Co), nickel (Ni), copper (Cu), zinc (Zn), zirconium (Zr), niobium (Nb), molybdenum (Mo), ruthenium (Ru), rhodium (Rh), palladium (Pd), silver (Ag), hafnium (Hf), tantalum (Ta), tungsten (W), technetium (Tc), rhenium (Re), Osmium (Os), iridium (Ir), platinum (Pt) and gold (Au).

2. The magnetoresistance effect element according to claim 1, wherein a spin filtering takes place when conduction electrons which constitute the sense current pass near the film so that one of up spin electrons and down spin electrons preferentially passes.

3. The magnetoresistance effect element according to claim 1, wherein a Fermi speed of up spin electrons and a Fermi speed of down spin electrons which constitute the sense current are different in a region of the first or second magnetic layer, the region adjoining the film.

4. The magnetoresistance effect element according to claim 1, wherein a mean thickness of the film is in a range between one atomic layer and three atomic layers.

5. The magnetoresistance effect element according to claim 1, wherein the film is formed substantially uniform.

6. The magnetoresistance effect element according to claim 1, wherein the first or second magnetic layer which includes or adjoins the film is made of a ferromagnetic material including at least one selected from the group consisting of iron (Fe), cobalt (Co), and nickel (Ni).

7. The magnetoresistance effect element according to claim 1, wherein the film includes at least one element selected from the group consisting of ruthenium (Ru), rhodium (Rh), silver (Ag), rhenium (Re), and gold (Au).

8. The magnetoresistance effect element according to claim 1, wherein the film includes at least one element selected from the group consisting of titanium (Ti), vanadium (V), chromium (Cr), manganese (Mn), hafnium (Hf), and tungsten (W).

9. The magnetoresistance effect element according to claim 1, wherein the film includes at least one element selected from the group consisting of zinc (Zn), zirconium (Zr), niobium (Nb), molybdenum (Mo), ruthenium (Ru), rhodium (Rh), palladium (Pd), tantalum (Ta), iridium (Ir), and platinum (Pt).

10. The magnetoresistance effect element according to claim 1, wherein the film includes at least one element selected from the group consisting of magnesium (Mg), aluminum (Al), and silicon (Si).

11. The magnetoresistance effect element according to claim 1, wherein the film includes at least one element selected from the group consisting of magnesium (Mg), aluminum (Al), silicon (Si), titanium (Ti), vanadium (V), chromium (Cr), manganese (Mn), zirconium (Zr), hafnium (Hf), tantalum (Ta), and tungsten (W)).

12. The magnetoresistance effect element according to claim 1, wherein the film has an oxide, and the film includes at least one element selected from the group consisting of iron (Fe), cobalt (Co), and nickel (Ni).

\* \* \* \* \*